(12) United States Patent
Sugiyama et al.

(10) Patent No.: US 10,472,536 B2
(45) Date of Patent: Nov. 12, 2019

(54) COMPOSITION FOR FORMING LASER DIRECT STRUCTURING LAYER, KIT, AND METHOD FOR MANUFACTURING RESIN MOLDED ARTICLE WITH PLATED LAYER

(71) Applicant: MITSUBISHI ENGINEERING-PLASTICS CORPORATION, Tokyo (JP)

(72) Inventors: Masahide Sugiyama, Kanagawa (JP); Ryusuke Yamada, Kanagawa (JP); Tatsuya Kikuchi, Kanagawa (JP); Yasushi Yamanaka, Kanagawa (JP)

(73) Assignee: MITSUBISHI ENGINEERING-PLASTICS CORPORATION, Tokyo (JP)

( * ) Notice: Subject to any disclaimer, the term of this patent is extended or adjusted under 35 U.S.C. 154(b) by 0 days.

(21) Appl. No.: 15/321,895

(22) PCT Filed: Jun. 26, 2015

(86) PCT No.: PCT/JP2015/068536
§ 371 (c)(1),
(2) Date: Dec. 23, 2016

(87) PCT Pub. No.: WO2016/002660
PCT Pub. Date: Jan. 7, 2016

(65) Prior Publication Data
US 2017/0137660 A1 May 18, 2017

(30) Foreign Application Priority Data

| Jun. 30, 2014 | (JP) | 2014-134492 |
| Jul. 7, 2014 | (JP) | 2014-139550 |
| Sep. 29, 2014 | (JP) | 2014-198464 |
| Oct. 10, 2014 | (JP) | 2014-208644 |

(51) Int. Cl.
| C09D 131/04 | (2006.01) |
| C23C 18/20 | (2006.01) |
| C08L 101/12 | (2006.01) |
| C09D 7/61 | (2018.01) |
| C09D 7/40 | (2018.01) |
| C09D 177/00 | (2006.01) |
| C23C 18/16 | (2006.01) |
| H05K 3/10 | (2006.01) |
| H05K 3/18 | (2006.01) |
| H05K 3/00 | (2006.01) |

(52) U.S. Cl.
CPC .......... C09D 131/04 (2013.01); C08L 101/12 (2013.01); C09D 7/61 (2018.01); C09D 7/70 (2018.01); C09D 177/00 (2013.01); C23C 18/1667 (2013.01); C23C 18/20 (2013.01); H05K 3/105 (2013.01); H05K 3/182 (2013.01); H05K 3/0032 (2013.01)

(58) Field of Classification Search
CPC ................................. H01B 3/004; H01B 3/28
See application file for complete search history.

(56) References Cited

U.S. PATENT DOCUMENTS

| 4,389,451 A * | 6/1983 | Fujioka | G03G 5/104 162/138 |
| 4,500,603 A * | 2/1985 | Freundlich | B29C 43/24 428/141 |
| 5,324,766 A * | 6/1994 | Ikejiri | H05K 1/0346 524/433 |
| 5,559,592 A * | 9/1996 | Larson | G03G 15/169 399/237 |
| 2009/0226728 A1* | 9/2009 | Onoe | C08F 255/00 428/413 |
| 2011/0057858 A1 | 3/2011 | Yan et al. | |
| 2012/0276390 A1 | 11/2012 | Ji et al. | |
| 2013/0288120 A1* | 10/2013 | Iida | C09J 7/35 429/211 |
| 2014/0002311 A1 | 1/2014 | Takano et al. | |
| 2014/0287151 A1* | 9/2014 | Thaker | C09D 5/26 427/466 |
| 2017/0022358 A1* | 1/2017 | Schrauwen | C08L 51/04 |

(Continued)

FOREIGN PATENT DOCUMENTS

| DE | 102012100299 A1 | 7/2013 |
| DE | 102012105765 A1 | 12/2013 |

(Continued)

OTHER PUBLICATIONS

International Preliminary Report on Patentability (forms PCT/IPEA/409, PCT/IB/338 and PCT/IPEA/416), dated Jan. 5, 2017, for International Application No. PCT/JP2015/068536, with an English translation.

(Continued)

*Primary Examiner* — Brieann R Johnston
(74) *Attorney, Agent, or Firm* — Birch, Stewart, Kolasch & Birch, LLP

(57) ABSTRACT

Making formation of a plated layer on a surface of a resin molded article possible, without adding the LDS additive to the thermoplastic resin composition. Provided is a composition for forming a laser direct structuring layer, the composition comprising a water-compatible organic substance, water, and a laser direct structuring additive. Further provided is a kit having the composition for forming a laser direct structuring layer and a method for manufacturing a resin molded article with a plated layer, which uses the composition for forming a laser direct structuring layer.

24 Claims, 2 Drawing Sheets

(56) References Cited

U.S. PATENT DOCUMENTS

2017/0137611 A1* 5/2017 Kniess .................... C08K 3/22
2017/0175271 A1* 6/2017 Zhou ..................... C09D 11/52
2017/0367182 A1* 12/2017 Wu ........................ B32B 27/32

FOREIGN PATENT DOCUMENTS

| | | |
|---|---|---|
| JP | 10-183362 A | 7/1998 |
| JP | 2000-154266 A | 6/2000 |
| JP | 2003-96221 A | 4/2003 |
| JP | 2004-534408 A | 11/2004 |
| JP | 2011-68995 A | 4/2011 |
| WO | WO 91/09986 A1 | 7/1991 |
| WO | WO 2011/076729 A1 | 6/2011 |
| WO | WO 2011/076730 A1 | 6/2011 |
| WO | WO 2011/095632 A1 | 8/2011 |
| WO | WO 2012/128219 A1 | 9/2012 |
| WO | WO 2013/189486 A1 | 12/2013 |
| WO | WO 2014/043385 A2 | 3/2014 |
| WO | WO-2014187360 A1 * 11/2014 | ............. H05K 3/185 |

OTHER PUBLICATIONS

International Search Report and Written Opinion of the International Searching Authority (forms PCT/ISA/210, PCT/ISA/237 and PCT/ISA/220), dated Sep. 29, 2015, for International Application No. PCT/JP2015/068536, with an English translation of the International Search Report.

Extended European Search Report for corresponding European Application No. 15814582.1, dated Feb. 1, 2018.

\* cited by examiner

COMPOSITION FOR FORMING LASER DIRECT STRUCTURING LAYER, KIT, AND METHOD FOR MANUFACTURING RESIN MOLDED ARTICLE WITH PLATED LAYER

TECHNICAL FIELD

This invention relates to a composition for forming a laser direct structuring layer, and further to a kit having the composition for forming a laser direct structuring layer and a thermoplastic resin composition. This invention also relates to a method for manufacturing a resin molded article with a plated layer, which uses the composition for forming a laser direct structuring layer.

BACKGROUND ART

With recent development in mobile phones including smartphone, many investigations have been made on methods of fabricating an antenna inside the mobile phones. There has been a particular need for enabling three-dimensional design of the antenna inside the mobile phones. Laser direct structuring (occasionally referred to as "LDS", hereinafter) having attracted public attention is one of known methods of forming such three-dimensional antenna. LDS is a technique of forming a plated layer, typically by irradiating laser to the surface of a resin molded article that contains an LDS additive, to thereby activate only a portion irradiated by the laser, and then by applying a metal to the activated portion. A feature of the technique is that a metal structure, such as antenna, may be fabricated directly on the surface of a resin base, without using an adhesive or the like. The LDS technique is disclosed for example in Patent Literatures 1 to 4.

Patent Literature 5 discloses conductor tracks placed on an electrically non-conductive supporting material, which are comprised of metal nuclei and of a metallization subsequently applied thereto, whereby the metal nuclei are produced by using electromagnetic radiation to break up electrically non-conductive metal compounds contained in the supporting material in a dispersed manner. The electrically non-conductive metal compounds are formed from insoluble inorganic oxides, which are highly stable with regard to heat, stable in an acidic or alkaline aqueous metallization bath, and which are higher oxides having the spinel structure, or are simple-d-metal oxides or mixtures thereof, or mixed metal compounds having spinel-like structures, and these metal compounds remain unchanged in unirradiated areas. Patent Literature 5 also describes a process of coating the electrically non-conductive higher oxides on a structural member to forma cover layer, allowing the cover layer to release heavy metal nuclei upon being irradiated by electromagnetic radiation selectively in a region where the conductor tracks will be formed, and then chemically reducing the region to metallize it.

CITATION LIST

Patent Literature

[Patent Literature 1] WO2011/095632 pamphlet
[Patent Literature 2] WO2011/076729 pamphlet
[Patent Literature 3] WO2011/076730 pamphlet
[Patent Literature 4] WO2012/128219 pamphlet
[Patent Literature 5] JP-T-2004-534408

SUMMARY OF THE INVENTION

Technical Problem

The LDS technique, when tried by way of adding the LDS additive to a thermoplastic resin, will however need a large amount of LDS additive. Although the LDS additive might act effectively in formation of the plated layer, it will be a foreign matter in the final form of resin molded article. In particular, depending on types of the LDS additive, it may adversely affect various performances, or some other additive contained in the thermoplastic resin composition may adversely affect the plated layer-forming performance of the LDS additive.

Meanwhile, Patent Literature 5 also describes that a process of coating the electrically non-conductive higher oxides on a supporting material to form a cover layer, allowing the cover layer to release heavy metal nuclei upon being irradiated by electromagnetic radiation, and then chemically reducing the irradiated region to metallize it. There is, however, no specific description on how the electrically non-conductive higher oxides are applied to cover the supporting material.

It is therefore an object of this invention to solve the problems described above, and to enable formation of the plated layer on the surface of the resin molded article, without adding the LDS additive to the thermoplastic resin composition.

Solution to Problem

After extensive investigations conducted under such situation, the present inventors found that the plated layer may properly be formed on the surface of the resin molded article, by forming on the surface of the resin molded article a layer that contains a water-compatible organic substance, water, and an LDS additive, even without mixing the LDS additive to the thermoplastic resin composition. The finding led us to complete this invention.

More specifically, the present inventors found that the above-described problems may be solved by means <1> below, and preferably by means <2> to <22>.

<1> A composition for forming a laser direct structuring layer, the composition comprising a water-compatible organic substance, water, and a laser direct structuring additive.

<2> The composition for forming a laser direct structuring layer of <1>, wherein the water-compatible organic substance is a paste.

<3> The composition for forming a laser direct structuring layer of <1> or <2>, containing 0.05 to 45 parts by weight of the laser direct structuring additive, per 100 parts by weight in total of the water-compatible organic substance and water.

<4> The composition for forming a laser direct structuring layer of any one of <1> to <3>, wherein the composition for forming a laser direct structuring layer contains 0.5 to 30% by weight of the water-compatible organic substance.

<5> The composition for forming a laser direct structuring layer of any one of <1> to <4>, wherein the water-compatible organic substance is selected from polyvinyl alcohol paste, hydroxyethyl cellulose, gelatin, emulsion-type vinyl acetate resin-based adhesive, and, water-soluble polyurethane.

<6> A kit comprising the composition for forming a laser direct structuring layer described in <1>, and a thermoplastic resin composition containing a thermoplastic resin.

<7> The kit of <6>, wherein the thermoplastic resin composition contains substantially no laser direct structuring additive.
<8> The kit of <6> or <7>, wherein the thermoplastic resin is a crystalline resin.
<9> The kit of <8>, wherein the crystalline resin is a polyamide resin.
<10> The kit of <8>, wherein the crystalline resin is a thermoplastic polyester resin.
<11> The kit of <6> or <7>, wherein the thermoplastic resin is an amorphous resin.
<12> The kit of <11>, wherein the amorphous resin is a polycarbonate resin.
<13> The kit of any one of <6> to <12>, wherein the thermoplastic resin composition contains a dye-pigment and/or fire retardant composition.
<14> The kit of any one of <6> to <12>, wherein the thermoplastic resin composition contains a pigment and/or fire retardant composition.
<15> The kit of any one of <6> to <14>, wherein the thermoplastic resin composition contains a black dye-pigment.
<16> The kit of any one of <6> to <15>, wherein the thermoplastic resin composition contains an antimony-containing fire retardant or fire retardant auxiliary.
<17> The kit of any one of <6> to <16>, wherein the thermoplastic resin composition contains a halogen-containing fire retardant.
<18> A method for manufacturing a resin molded article with a plated layer, comprising:
applying the composition for forming a laser direct structuring layer described in any one of <1> to <5>, to a surface of a thermoplastic resin molded article;
removing the water; and
then irradiating laser to form a plated layer.
<19> The method for manufacturing a resin molded article with a plated layer of <18>, the method further comprising washing the plated layer after the plated layer was formed.
<20> The method for manufacturing a resin molded article with a plated layer of <18> or <19>, wherein the thermoplastic resin molded article comprises a crystalline resin.
<21> The method for manufacturing a resin molded article with a plated layer of <18> or <19>, wherein the thermoplastic resin molded article comprises an amorphous resin.
<22> The method for manufacturing a resin molded article with a plated layer of any one of <18> to <21>, using the kit described in any one of claims 6 to 17.

Advantageous Effects of Invention

It now became possible to form the plated layer on the surface of the resin molded article, even without mixing the LDS additive to the thermoplastic resin composition.

DESCRIPTION OF EMBODIMENTS

This invention will be detailed below. In this specification, all numerical ranges given using "to", placed between numerals, mean the ranges containing both numerals as the lower and upper limit values. In this specification, all "groups" such as alkyl group may have a substituent, or do not necessarily have a substituent. All numbers of carbon atoms, when designated, shall indicate the numbers of carbon atoms including the carbon atoms contained in the substituent. Solid and liquid in this invention are defined by the states at 25° C. unless otherwise not specifically noted.

This invention characteristically uses the composition for forming an LDS layer which contains a water-compatible organic substance, water, and an LDS additive, separately from the resin molded article. With such configuration, it now becomes possible to form the plated layer on the surface of the resin molded article, without mixing the LDS additive to the thermoplastic resin composition.

Figure 1:
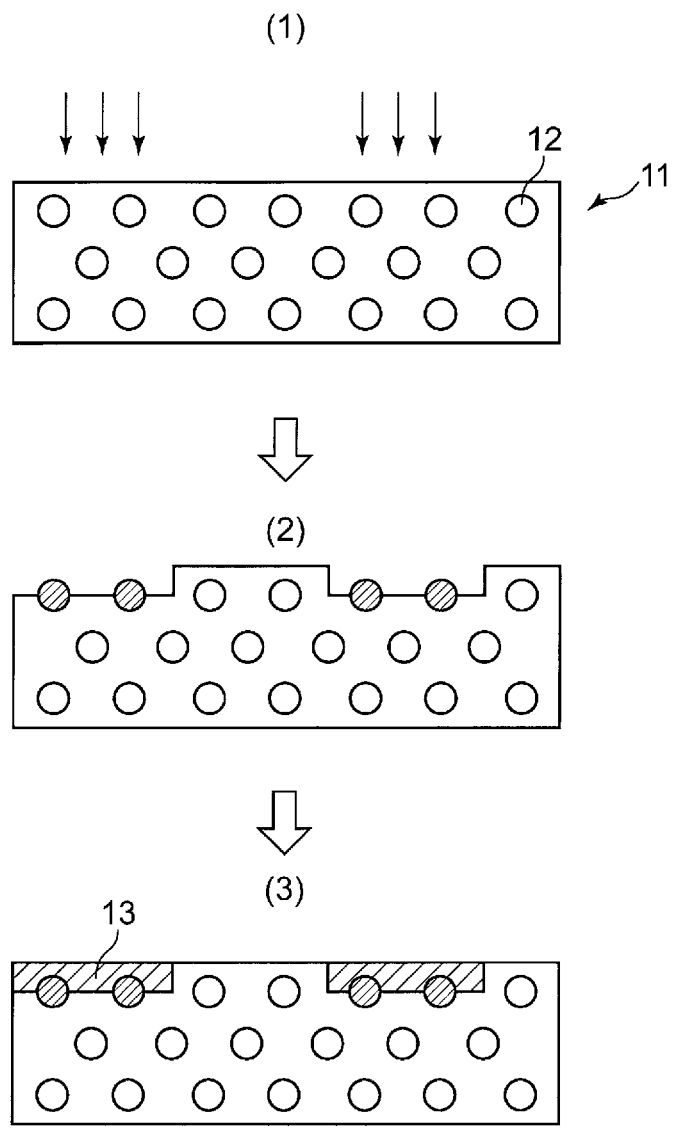
FIG. 1 A schematic drawing illustrating conventional processes of forming a plated layer on the surface of a resin molded article.

This will further be explained referring to the attached drawings. FIG. 1 illustrates conventional processes of forming the plated layer on the surface of the resin molded article. In FIG. 1, reference numeral 11 denotes a molded article of a thermoplastic resin composition, and 12 denotes an LDS additive. In the conventional method, the thermoplastic resin composition has been subjected to molding with the LDS additive mixed therein. When laser is irradiated, as illustrated in FIG. 1(1), only to portions where the plated layers are expected to be formed (portions pointed by the arrows FIG. 1(1)), the LDS additive is activated at the portions irradiated by the laser (FIG. 1(2)). When applied with a plating solution, the resin molded article having been kept in such activated state will have plated layers 13 formed on the surface thereof only in the portions irradiated by the laser (FIG. 1(3)).

Although the conventional method has been approved to be beneficial, addition of the LDS additive to the thermoplastic resin inevitably increases the amount of addition of the LDS additive relative to the resin molded article. In more detail, the LDS additive will suffice if it resides only in the surficial portion of the resin molded article on which the plated layer is formed, but when mixed into the thermoplastic resin composition, the LDS additive will be dispersed throughout the resin molded article as illustrated in FIG. 1(1), and this means excessive mixing of the LDD additive than required for forming the plated layer. Some of the LDS additive is expensive, and has been desired to be reduced in the amount relative to the resin molded article. Another problem is that the LDS additive, although beneficial in the process of forming the plated layer, will be a foreign matter in the final form of resin molded article. Some types of the LDS additive will even adversely affect various performances. More specifically, the LDS additive may damage glass fiber to prevent its mechanical strength from being demonstrated. Some of the resin compositions added with an additive such as fire retardant composition or pigment may fail in properly allowing the plated layer to be formed thereon, even if the LDS additive were added.

Figure 2:
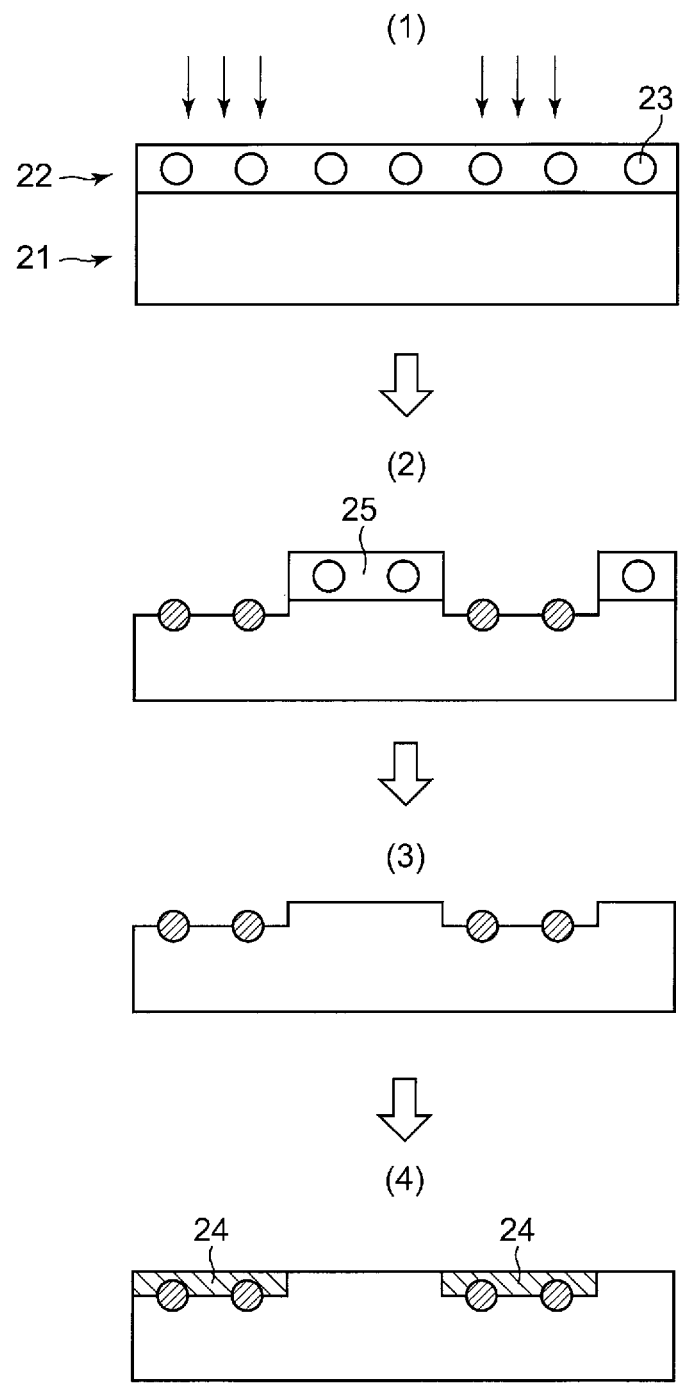
FIG. 2 A schematic drawing illustrating inventive processes of forming a plated layer on the surface of a resin molded article.

Meanwhile, FIG. 2 is a schematic drawing illustrating inventive processes of forming the plated layer on the surface of the resin molded article. In FIG. 2(1), reference numeral 21 denotes a resin molded article, 22 denotes an LDS layer, and 23 denotes an LDS additive.

When the LDS layer-forming composition of this invention is applied (typically by coating) to the surface of the resin molded article 21, a thin LDS layer 22 having the LDS additive 23 uniformly dispersed therein is formed (FIG. 2(1)). The LDS layer 22 is then dried to remove water, and laser is irradiated on portions thereof where the plated layer will be formed (FIG. 2(1)). The LDS additive is now activated only in the portions irradiated with laser. The plating solution is then applied to the surface of the resin molded article having such activated portions. The resin molded article after applied with the plating solution will have a plated layer 24 formed only on the laser-irradiated portions (FIG. 2(4)). As a consequence, it now becomes possible to form the plated layer on the surface of the resin molded article, without mixing the LDS additive into the thermoplastic resin composition.

Now the LDS additive needs to be fixed to the surface of the resin molded article, when exposed to the plating solution. In this invention, the LDS additive is supposed to be fixed to the surface of the resin molded article, since the resin of the resin molded article is melted in the surficial portion under irradiation by laser, and then re-solidified (FIG. 2(2)). The LDS additive is also supposed to be fixed to the surface of the resin molded article, as a result of carbonization of the water-compatible organic substance due to heat produced by the laser irradiation.

For uniform formation of the plated layer, the LDS layer-forming composition needs to be able to form, over the surface of the resin molded article, the LDS layer having the LDS additive dispersed therein in a substantially uniform manner. Since this invention employs a composition containing a water-compatible organic substance and water, and having the LDS additive dispersed therein, so that it now becomes possible to form, over the surface of the resin molded article, the LDS layer having the LDS additive dispersed therein in a substantially uniform manner. When dried, this type of LDS layer will lose water by evaporation, and will have the LDS additive remained on the surface of the resin molded article while keeping the dispersed state thereof over the surface of the resin molded article.

The processes illustrated in FIG. 2 includes a process of washing off the portions 25 of the LDS layer having not been irradiated by laser (FIG. 2(3)). This process is not essential in this invention. The washing process will be detailed later.

The following paragraphs will detail the LDS layer-forming composition, the kit, and the method for manufacturing a resin molded article with a plated layer of this invention.

<Composition for Forming Laser Direct Structuring Layer>

The composition for forming a laser direct structuring layer characteristically contains a water-compatible organic substance, water, and a laser direct structuring additive. With such configuration, it now becomes possible to form the plated layer on the surface of the resin molded article, without mixing the LDS additive to the thermoplastic resin composition.

<<Water-Compatible Organic Substance>>

The water-compatible organic substance used in this invention is a water-soluble or water-suspendable substance, and is preferably water-soluble. Temperature of dissolution or suspension is preferably, but not specifically limited to, room temperature (25° C., for example).

Such water-compatible organic substance is beneficial since it can be dissolved or dispersed into water, and since it can be washed off together with the LDS additive in the unirradiated portions, when disused after the plated layer was formed.

The water-compatible organic substance may be a small molecule (typically having a molecular weight of smaller than 1000) or macromolecule (typically having a molecular weight of 1000 or larger), wherein the macromolecule is preferable. The water-compatible organic substance preferably has a good adhesiveness with the resin. The water-compatible organic substance is also preferably a solid at 25° C.

The water-compatible organic substance used in this invention is not specifically limited. Specific examples include paste (starch paste, polyvinyl alcohol paste (PVA paste), cellulose (hydroxyethyl cellulose (HEC), hydroxymethyl cellulose (HMC), carboxymethyl cellulose (CMC), methyl cellulose (MC)), gelatin, pectin, xanthan gum, guar gum, carrageenan, polyethylene glycol (PEG), water-soluble polyurethane, emulsion-type vinyl acetate resin-based adhesive, water-soluble vinyl acetate copolymerized resin-based adhesive, water-soluble isobutene/maleic anhydride copolymerized resin-based adhesive, water-soluble acryl copolymerized resin-based adhesive, water-soluble styrene/butadiene rubber copolymer-based adhesive, and glue, wherein preferable examples include PVA paste, hydroxyethyl cellulose, gelatin, emulsion-type vinyl acetate resin-based adhesive, and water-soluble polyurethane.

Also commercially available products such as "Mokko-yo Bondo (glue for wood)" (registered trademark) are usable.

The content of the water-compatible organic substance in the LDS layer-forming composition of this invention is preferably 0.1 to 50% by weight, and more preferably 1 to 30% by weight, of the LDS layer-forming composition. Only a single species, or two or more species, of the water-compatible organic substances may be contained. When two or more species are contained, the total content preferably falls in the above-described ranges.

<<Water>>

The LDS layer-forming composition contains water. By containing water, it now becomes possible to form the LDS layer having the LDS additive uniformly dispersed therein.

Water may be cold or warm, and preferably at a temperature of 20 to 40° C.

The amount of mixing of water in the LDS layer-forming composition of this invention is preferably 1 to 99% by weight, and more preferably 50 to 98% by weight. In order to make the LDS layer-forming composition of this invention more easier to coat, it is a possible choice to control the amount of addition of water to control the viscosity. Taking the coatability into consideration, the LDS layer-forming composition preferably has a viscosity at 25° C. of 0.01 to 200 Pa·s, and more preferably 0.1 to 150 Pa·s.

<<LDS Additive>>

The LDS layer-forming composition contains the LDS additive.

The LDS additive in this invention means a compound capable of forming thereon the plated layer, when 10 parts by weight of a candidate additive of the LDS additive is added to 100 parts by weight of the thermoplastic resin (for example, polyamide resin and/or polycarbonate resin), exposed to YAG laser of 1064 nm wavelength irradiated at an output of 13 W, a frequency of 20 kHz, and scanning speed of 2 m/s, and then subjected to electroless plating using a MID Copper 100 XB Strike plating bath (from MacDermid Performance Solutions) so as to apply a metal to the laser-irradiated surface.

The LDS additive used in this invention may either be synthetic ones or commercially available ones. The commercially available ones are not always necessarily be those marketed as the LDS additive, but may be substances intended for other applications so long as they satisfy the requirements of the LDS additive in this invention. Only a single species of the LDS additive may be used, or two or more species thereof may be used in combination.

Preferred embodiments of the LDS additive used in this invention will be described below, of course without limiting this invention.

A first embodiment of the LDS additive used this invention relates to a compound containing copper and chromium. The LDS additive of the first embodiment preferably contains 10 to 30% by weight of copper. It also preferably contains 15 to 50% by weight of chromium. The LDS additive of the first embodiment is preferably an oxide containing copper and chromium.

Copper and chromium are preferably contained in the form of spinel structure. The spinel structure is one of representative crystal structures found in $AB_2O_4$-type compound (A and B represent metal elements) that belongs to double oxide.

The LDS additive of the first embodiment may contain other trace metal besides copper and chromium. Such other metal is exemplified by antimony, tin, lead, indium, iron, cobalt, nickel, zinc, cadmium, silver, bismuth, arsenic, manganese, magnesium and calcium, wherein manganese is preferable. These metals may exist in the form of oxide.

A preferable example of the LDS additive of the first embodiment is an LDS additive containing 10% by weight or less of metal oxide other than copper chromium oxide.

A second embodiment of the LDS additive used in this invention relates to an oxide containing antimony and/or phosphorus, and tin, and is preferably an oxide containing antimony and tin.

The LDS additive of the second embodiment is preferably such that the amount of mixing tin is larger than the amount of mixing of phosphorus and/or antimony, and preferably such that tin accounts for 80% by weight or more of the total content of phosphorus and antimony.

In particular, the LDS additive of the second embodiment is preferably an oxide containing antimony and tin, wherein the amount of mixing of tin is preferably larger than the amount of mixing of antimony, and the tin content relative to the total content of tin and antimony is preferably 80% by weight or more.

More specifically, the LDS additive of the second embodiment is exemplified by antimony-doped tin oxide, antimony oxide-doped tin oxide, phosphorus-doped tin oxide, and phosphorus oxide-doped tin oxide; wherein antimony-doped tin oxide, and antimony oxide-doped tin oxide are preferable; and antimony oxide-doped tin oxide is more preferable. For example, in the LDS additive containing phosphorus and tin oxide, the content of phosphorus is preferably 1 to 20% by weight. In the LDS additive containing antimony and tin oxide, the content of antimony is preferably 1 to 20% by weight. In the LDS additive containing phosphorus, antimony and tin oxide, the content of phosphorus is preferably 0.5 to 10% by weight, and the content of antimony is preferably 0.5 to 10% by weight.

The LDS additive of a third embodiment used in this invention preferably contains at least two species of metals, and an electrically conductive oxide having a resistivity of $5 \times 10^3$ Ω·cm or smaller. The electrically conductive oxide preferably has a resistivity of $8 \times 10^2$ Ω·cm or smaller, more preferably $7 \times 10^2$ Ω·cm or smaller, and even more preferably $5 \times 10^2$ Ω·cm or smaller. The lower limit may be, but not specifically limited to, $1 \times 10^1$ Ω·cm or above for example, and more preferably $1 \times 10^2$ Ω·cm or above.

The resistivity of the electrically conductive oxide in this invention is generally given by powder resistivity, which is measured using a tester "Model 3223" from Yokogawa Electric Corporation, after placing 10 g of fine powder of the electrically conductive oxide into a cylinder with an inner coating of Teflon (registered trademark) and an inner diameter of 25 mm, and by pressurizing the powder at 100 kg/cm² (packing ratio=200).

Although the LDS additive used in the third embodiment is not specifically limited so long as it contains the electrically conductive oxide having a resistivity of $5 \times 10^3$ Ω·cm or smaller, it preferably contains at least two species of metals, and more specifically contains the Group n (n is an integer of 3 to 16) metal in the periodic table, and the Group (n+1) metal. n preferably represents an integer of 10 to 13, and more preferably 12 or 13.

In the LDS additive used in the third embodiment, assuming now the total content of the Group n (n is an integer of 3 to 16) metal in the periodic table and the Group (n+1) metal as 100 mol %, the content of either one metal is preferably 15 mol % or less, more preferably 12 mol % or less, and particularly 10 mol % or less. The lower limit is 0.0001 mol % or above, but without special limitation. By limiting the contents of two or more species of metals within the above-described ranges, the platability may be improved. In this invention, Group (n+1)-doped Group n metal oxide is particularly preferable.

In the LDS additive used in the third embodiment, 98% by weight or more of metal component contained in the LDS additive is preferably composed of the Group n metal and the Group (n+1) metal in the periodic table.

Metals that belong to Group n in the periodic table are exemplified by those that belong to Group 3 (scandium, yttrium), Group 4 (titanium, zirconium, etc.), Group 5 (vanadium, niobium, etc.), Group 6 (chromium, molybdenum, etc.), Group 7 (manganese, etc.), Group 8 (iron, ruthenium, etc.), Group 9 (cobalt, rhodium, iridium, etc.), Group 10 (nickel, palladium, platinum), Group 11 (copper, silver, gold, etc.), Group 12 (zinc, cadmium, etc.), Group 13 (aluminum, gallium, indium, etc.), Group 14 (germanium, tin, etc.), Group 15 (arsenic, antimony, etc.), and Group 16 (selenium, tellurium, etc.). Also metal oxides containing these metals are usable. Among them, Group 12 (n=12) metal or metal oxide thereof is preferable, and zinc is more preferable.

Metals that belong to Group (n+1) in the periodic table are exemplified by those that belong to Group 4 (titanium, zirconium, etc.), Group 5 (vanadium, niobium, etc.), Group 6 (chromium, molybdenum, etc.), Group 7 (manganese, etc.), Group 8 (iron, ruthenium, etc.), Group 9 (cobalt, rhodium, iridium, etc.), Group 10 (nickel, palladium, platinum), Group 11 (copper, silver, gold, etc.), Group 12 (zinc, cadmium, etc.), Group 13 (aluminum, gallium, indium, etc.), Group 14 (germanium, tin, etc.), 15 Group (arsenic, antimony, etc.), and Group 16 (selenium, tellurium, etc.). Also metal oxides containing these metals are usable. Among them, Group 13 (n+1=13) metal or metal oxide thereof is preferable, aluminum or gallium is more preferable, and aluminum is even more preferable.

The LDS additive used in the third embodiment may contain metal other than the electrically conductive metal oxide. The metal other than the electrically conductive metal oxide is exemplified by antimony, titanium, indium, iron, cobalt, nickel, cadmium, silver, bismuth, arsenic, manganese, chromium, magnesium, and calcium. These metals may exist in the form of oxide. The content of each of these metals is preferably 0.01% by weight or less relative to the LDS additive.

From the viewpoint of increasing the L value, the LDS additive used in the third embodiment preferably has an antimony content of 3% by weight or less relative to the LDS additive, more preferably 1% by weight or less, and even more preferably 0.01% by weight or less. It is particularly preferable to contain substantially no antimony. "To contain substantially no antimony" herein means that antimony is not contained to an extent enough to affect the effects of this invention.

The LDS additive used in this invention preferably has an average particle size of 0.01 to 100 µm, more preferably 0.05 to 30 µm, and even more preferably 0.05 to 15 µm. With such average particle size, the plated layer will have an improved surface profile.

The amount of mixing of the LDS additive in the LDS layer-forming composition is preferably 0.01 to 50% by weight. The amount is also preferably 0.05 parts by weight or more relative to 100 parts by weight in total of the water-compatible organic substance and water, more preferably 0.5 parts by weight or more, even more preferably 1 part by weight or more, and yet more preferably 3 parts by weight or more. The amount is also preferably 45 parts by weight or less relative to 100 parts by weight in total of the water-compatible organic substance and water, more preferably 40 parts by weight or less, even more preferably 35 parts by weight or less, yet more preferably 29 parts by weight or less, yet more preferably 23 parts by weight or less, and particularly 15 parts by weight or less. Within such ranges, the plating will have an improved appearance.

This invention is beneficial in that the amount of LDS additive in the final form of the resin molded article with the plated layer may be reduced.

<<Other Components of LDS Layer-Forming Composition>>

The LDS layer-forming composition used in this invention may be composed only of the water-compatible organic substance, water and the LDS additive, but may also contain other components. Such other components are exemplified typically by those used for paint or water-compatible organic substance, and particularly by dispersing agent, sensitizer, compatibilizing agent, and dye-pigment. In particular, black dye-pigment such as carbon black, when mixed, can absorb heat of laser irradiation, to thereby melt the surface of the resin molded article composed of the thermoplastic resin composition, and to improve adhesiveness between the resin molded article and the LDS additive.

<<Characteristics of LDS Layer-Forming Composition>>

The LDS layer-forming composition is a dispersion liquid having the LDS additive dispersed therein. The water-compatible organic substance may be either dissolved or dispersed in water. By applying such LDS layer-forming composition to the surface of the resin molded article, it is now possible to form the LDS layer having the LDS additive uniformly dispersed therein. It therefore suffices that the LDS layer-forming composition exists in the form of dispersion liquid having the LDS additive dispersed therein, immediately before being applied to the surface of the resin molded article, and is not necessarily be kept dispersed after allowed to stand still for a long time.

<Kit>

The kit of this invention characteristically has a composition for forming a laser direct structuring layer, and a thermoplastic resin composition containing a thermoplastic resin. By using such kit, it is now possible to form the plated layer on the surface of the resin molded article, without mixing the LDS additive to the thermoplastic resin composition.

<<LDS Layer-Forming Composition>>

The LDS layer-forming composition described above will suffice for LDS layer-forming composition, and is defined by the same preferable ranges.

<<Thermoplastic Resin Composition Containing Thermoplastic Resin>>

The thermoplastic resin composition in this invention contains a thermoplastic resin. The thermoplastic resin may be either crystalline resin or amorphous resin without special limitation, wherein crystalline resin is preferable.

Specific examples of the thermoplastic resin include polycarbonate resin, mixture of polycarbonate resin and polystyrene resin, alloy of polyphenylene ether resin and polystyrene resin, alloy of polyphenylene ether resin and polyamide resin, thermoplastic polyester resin, methyl methacrylate/acrylonitrile/butadiene/styrene copolymerized resin, methyl methacrylate/styrene copolymerized resin, methyl methacrylate resin, rubber-reinforced methyl methacrylate resin, polyamide resin, polyacetal resin, polylactate-based resin, polyolefinic resin, and polyphenylene sulfide resin. In this invention, the composition preferably contains at least one species selected from polycarbonate resin, mixture of polycarbonate resin and polystyrene resin, thermoplastic polyester resin, and polyamide resin; more preferably contains at least one species selected from polycarbonate resin, mixture of polycarbonate resin and polystyrene resin, and polyamide resin; and even more preferably contains polyamide resin.

Preferred embodiments will be described below.

Mode of Containing Polycarbonate Resin as Major Ingredient

A first embodiment of the thermoplastic resin in this invention is exemplified by a mode in which the thermoplastic resin contains a polycarbonate resin as a major ingredient. In the first embodiment, the polycarbonate resin preferably accounts for 30 to 100% by weight of the total resin component, preferably 50 to 100% by weight, and more preferably 80 to 100% by weight.

Polycarbonate Resin

The polycarbonate resin used in this invention may be any of aromatic polycarbonate, aliphatic polycarbonate, and aromatic-aliphatic polycarbonate without special limitation, more preferably be aromatic polycarbonate, and even more preferably be thermoplastic aromatic polycarbonate polymer or copolymer, obtained by allowing an aromatic dihydroxy compound to react with phosgene or carbonate diester.

The aromatic dihydroxy compound is preferably exemplified by 2,2-bis(4-hydroxyphenyl)propane (i.e., bisphenol A), tetramethylbisphenol A, bis(4-hydroxyphenyl)-p-diisopropylbenzene, hydroquinone resorcinol, and 4,4-dihydroxydiphenyl, and more preferably by bisphenol A. For the purpose of preparing a composition with a high fire retardancy, usable is such aromatic dihydroxy compound having bound thereto one or more tetraalkylphosphonium sulfonate, or a polymer or oligomer having a siloxane structure terminated on both ends by phenolic hydroxy groups.

Preferable examples of the polycarbonate resin used in this invention include polycarbonate resin derived from 2,2-bis(4-hydroxyphenyl)propane; and polycarbonate copolymer derived from 2,2-bis(4-hydroxyphenyl)propane and other aromatic dihydroxy compound.

The polycarbonate resin preferably has a molecular weight of 14,000 to 30,000, more preferably 15,000 to 28,000, and even more preferably 16,000 to 26,000, in terms of viscosity-average molecular weight calculated from the viscosity of solution, when measured in methylene chloride as a solvent at 25° C. With the viscosity-average controlled within the above-described ranges, the resin will desirably have an improved mechanical strength and an improved formability.

Methods of manufacturing the polycarbonate resin is not specifically limited, so that polycarbonate resins manufactured either by the phosgene process (interfacial polymerization) or the fusion process (transesterification) may be used. In this invention, also usable is a polycarbonate resin manufactured by a typical fusion process followed by a process of controlling the content of terminal hydroxy groups.

The polycarbonate resin usable in this invention includes not only a polycarbonate resin as a virgin material, but also a polycarbonate resin regenerated from used products, that is, so-called recycled polycarbonate resin.

Regarding other polycarbonate resins usable in this invention, for example the description in paragraphs [0018] to [0066] of JP-A-2012-072338 may be referred to, the content of which is incorporated into the present specification.

The thermoplastic resin composition used in this invention may contain only a single species, or two or more species, of polycarbonate resins.

Mode of Containing Polycarbonate Resin and Styrene Resin

A second embodiment is exemplified by a case where the thermoplastic resin contains a polycarbonate resin and a styrene resin. More specifically, the resin preferably contains a resin component containing 40% by weight or more and 100% by weight or less of polycarbonate resin, and more than 0% by weight and 60% by weight or less of styrene-based resin, more preferably contains 40 to 90% by weight of polycarbonate resin and 60 to 10% by weight of styrene-based resin, and even more preferably contains 60 to 80% by weight of polycarbonate resin and 40 to 20% by weight of styrene-based resin.

As for details of the polycarbonate resin, the description of the first embodiment may be referred to.

Styrene-Based Resin

The styrene-based resin means at least one polymer species selected from the group consisting of styrene-based polymer composed of styrene-based monomers, copolymer formed by styrene-based monomer and other copolymerizable vinyl-based monomer, and copolymer obtained by polymerizing, under the presence of a rubbery polymer, styrene-based monomer or styrene-based monomer with other copolymerizable vinyl-based monomer.

Specific examples of the styrene-based monomer include styrene and styrene derivatives such as α-methylstyrene, p-methylstyrene, divinylbenzene, ethylvinylbenzene, dimethylstyrene, p-t-butylstyrene, bromostyrene and dibromostyrene. Among them, styrene is preferable. They may be used independently, or in a mixed form of two or more species.

The vinyl-based monomer copolymerizable with the styrene-based monomer is exemplified by vinylcyan compounds such as acrylonitrile and methacrylonitrile; alkyl acrylate esters such as methyl acrylate, ethyl acrylate, propyl acrylate, butyl acrylate, amyl acrylate, hexyl acrylate, 2-ethylhexyl acrylate, octyl acrylate, and cyclohexyl acrylate; alkyl methacrylate esters such as methyl methacrylate, ethyl methacrylate, propyl methacrylate, butyl methacrylate, amyl methacrylate, hexyl methacrylate, 2-ethylhexyl methacrylate, octyl methacrylate and cyclohexyl methacrylate; aryl acrylate esters such as phenyl acrylate and benzyl acrylate; aryl methacrylte esters such as phenyl methacrylate and benzyl methacrylate; epoxy group-containing acrylic esters or methacrylic esters such as glycidyl acrylate and glycidyl methacrylate; maleimide-based monomers such as maleimide, N,N-methylmaleimide, and N-phenylmaleimide; and α,β-unsaturated carboxylic acids or anhydrides thereof such as acrylic acid, methacrylic acid, maleic acid, maleic anhydride, fumaric acid, and itaconic acid.

The rubbery polymer copolymerizable with the styrene-based monomer is exemplified by polybutadiene; polyisoprene; styrene-butadiene random copolymer and block copolymer; acrylonitrile-butadiene random copolymer and block copolymer; acrylonitrile-butadiene copolymer; copolymer of alkyl acrylate ester or alkyl methacrylate ester with butadiene; polybutadiene-polyisoprene diene-based copolymer; ethylene-isoprene random copolymer and block copolymer; copolymer of ethylene and α-olefin such as ethylene-butene random copolymer and block copolymer; copolymer of ethylene and α,β-unsaturated carboxylic acid ester such as ethylene-methacrylate copolymer, and ethylene-butyl acrylate copolymer; ethylene-vinyl acetate copolymer; ethylene-propylene-nonconjugated diene terpolymer such as ethylene-propylene-hexadiene copolymer; acrylic rubber; and composite rubber composed of polyorganosiloxane rubber and polyalkyl acrylate or methacrylate rubber.

This type of styrene-based resin is exemplified by high-impact polystyrene (HIPS), acrylonitrile-styrene copolymer (AS resin), acrylonitrile-butadiene-styrene copolymer (ABS resin), methyl methacrylate-acrylonitrile-butadiene-styrene copolymer (MABS resin), acrylonitrile-styrene-acrylic rubber copolymer (ASA resin), acrylonitrile-ethylene propylene-based rubber-styrene copolymer (AES resin), styrene-methyl methacrylate copolymer (MS resin), and styrene-maleic anhydride copolymer.

While the styrene-based resin may be any of those manufactured by methods such as emulsion polymerization, solution polymerization, bulk polymerization, suspension polymerization or bulk/suspension polymerization, now in this invention, the styrene-based polymer, or styrene-based random copolymer or block copolymer is preferably any of those manufactured by bulk polymerization, suspension polymerization or bulk/suspension polymerization, and styrene-based graft copolymer is preferably any of those manufactured by bulk polymerization, bulk/suspension polymerization or emulsion polymerization.

The acrylonitrile-butadiene-styrene copolymer (ABS resin) that is particularly preferably used in this invention is a thermoplastic graft copolymer obtained by grafting acrylonitrile and styrene to a butadiene rubber component, and acrylonitrile-styrene copolymer. The butadiene rubber component preferably accounts for 5 to 40% by weight, more preferably 10 to 35% by weight, and particularly 13 to 25% by weight, per 100% by weight of ABS resin component. The rubber particle size is preferably 0.1 to 5 µm, more preferably 0.2 to 3 µm, even more preferably 0.3 to 1.5 µm, and particularly 0.4 to 0.9 µm. The rubber particle size may show either unimodal distribution, or bi- or higher modal distribution.

The thermoplastic resin composition used in this invention may contain only a single species of styrene-based resin, or may contain two or more species.

The resin may also contain a resin component other than the polycarbonate resin and styrene-based resin. Note, however, that these component in this embodiment is preferably 5% by weight or less of the total resin component.

Mode of Containing Polyamide Resin as Major Ingredient

A third embodiment of the thermoplastic resin of this invention is exemplified by a case where the thermoplastic resin contains a polyamide resin. When the polyamide resin is contained, the content thereof is preferably 80% by weight or more, more preferably 90% by weight or more, even more preferably 95% by weight or more, and particularly 99% by weight or more. The upper limit of the content of polyamide resin, when contained in the thermoplastic resin, is 100% by weight or below. When the polyamide resin is contained, also other resin component may be contained. Note however that the content of the other resin is preferably 5% by weight or less of the total resin component.

Polyamide Resin

The polyamide resin is a polymer having, as a repeating unit, acid amide obtained by ring-opening polymerization of lactam, polycondensation of aminocarboxylic acid, or polycondensation of diamine and dibasic acid, and is exemplified by polyamides 6, 11, 12, 46, 66, 610, 612, 6I, 6/66, 6T/6I, 6/6T, 66/6T, 66/6T/6I, polyamide MX, polytrimethylhexamethylene terephthalamide, polybis(4-aminocyclohexyl) methane dodecamide, polybis(3-methyl-4-aminocyclohexyl)methane dodecamide, and polyundecamethylene hexahydroterephthalamide. Note that "I" represents isophthalic acid component, and "T" represents terephthalic acid component.

The polyamide resin used in this invention is properly selected, taking various characteristics of these polyamide resins and intended applications of the molded article into consideration.

Among the above-described polyamide resin, preferable is a semiaromatic polyamide having an aromatic ring in the dicarboxylic acid component, or polyamide MX having an aromatic ring in the source diamine component, or polyamide resin obtained by mixing them, since it can easily yield a compound mixed with a relatively large amount of reinforcing filler such as glass fiber or carbon fiber.

The semiaromatic polyamide is specifically exemplified by 6I, 6T/6I, 6/6T, 66/6T and 66/6T/6I.

Meanwhile, the polyamide MX resin obtained by polycondensation of xylylene diamine having an aromatic ring in the source diamine component, with an $\alpha,\omega$-dibasic acid, is preferable since it can yield a resin composition having a particularly high strength. More preferable is a polyamide resin obtained by polycondensation of paraxylylene diamine and/or metaxylylene diamine, with an $\alpha,\omega$-straight chain aliphatic dibasic acid or aromatic dibasic acid having 6 to 12 carbon atoms; even more preferable is a polyamide MX resin obtained by using sebacic acid and/or adipic acid as the dicarboxylic acid component; and particularly preferable is polymetaxylylene adipamide.

Also mixtures of any of these polyamide resins having aromatic rings and aliphatic polyamide resin (e.g., polyamide 6, polyamide 66, etc.) are preferably used. As a result of mixing of such polyamide resin having aromatic rings, the thermoplastic resin will have an improved appearance and physical characteristics that have been achieved only limitedly by the aliphatic polyamide resin alone, when mixed with a large amount of filler. The ratio by weight of the polyamide resin having aromatic rings and the aliphatic polyamide resin, when mixed, is preferably 100:1 to 100:20.

Mode of Containing Thermoplastic Polyester Resin as Major Ingredient

A fourth embodiment of the thermoplastic resin of this invention is exemplified by the case where the thermoplastic resin contains a thermoplastic polyester resin as the major ingredient. In the fourth embodiment, the ratio of the thermoplastic polyester resin, in the total resin component, is preferably 51 to 100% by weight, more preferably 80 to 100% by weight, and even more preferably 90 to 100% by weight.

Thermoplastic Polyester Resin

Regarding the thermoplastic polyester resin, the description in paragraphs [0013] to [0016] of JP-A-2010-174223 may be referred to.

The polyester resin typically used is a mixture in which polybutylene terephthalate resin or polybutylene terephthalate resin accounts for 60% by weight or more, and preferably 80% by weight or more. A mixture of polybutylene terephthalate resin and polyethylene terephthalate resin, wherein the former accounts for 60% by weight or more, and even 80% by weight or more, is a preferred example of the polyester resin used in this invention. In such mixture of polybutylene terephthalate resin and polyethylene terephthalate resin, the content of polyethylene terephthalate resin is preferably 10 to 40% by weight, and more preferably 20 to 40% by weight.

As is commonly known, polybutylene terephthalate resin and polyethylene terephthalate resin have been mass-produced by allowing terephthalic acid or ester thereof to react with 1,4-butanediol or ethylene glycol, and have been marketed. In this invention, such commercially available resins may be used. Although some of the commercially available resin contain copolymerizable components other than terephthalic acid component and 1,4-butanediol component or ethylene glycol component, this invention can also employ the resin containing a small amount of copolymerizable component whose content is typically 10% by weight or less, and preferably 5% by weight or less.

The polybutylene terephthalate resin has an intrinsic viscosity of typically 0.5 to 1.5 dl/g, and particularly 0.6 to 1.3 dl/g. Below 0.5 dl/g, it will be difficult to obtain the resin composition with a high mechanical strength. Meanwhile above 1.5 dl/g, the resin composition will occasionally degrade the fluidity, and formability as a consequence. The content of the terminal carboxy group is preferably 30 meq/g or less. The content of tetrahydrofuran derived from 1,4-butanediol is preferably 300 ppm or less.

Meanwhile, the polyethylene terephthalate resin preferably has an intrinsic viscosity of typically 0.4 to 1.0 dl/g, and particularly 0.5 to 1.0 dl/g. Below 0.4 dl/g, the resin composition tends to degrade the mechanical characteristics, meanwhile above 1.0 dl/g, the resin composition tends to degrade the fluidity. Note that all intrinsic viscosities are measured in a phenol/tetrachloroethane (ratio by weight=1/1) mixed solvent at 30° C.

The thermoplastic resin composition used in this invention may contain only a single species of the thermoplastic polyester resin, or may contain two or more species.

In this embodiment, other resin component other than the thermoplastic polyester resin may be contained. The content of such other resin is, however, preferably 5% by weight or less of the total resin component.

Mode of Containing Polyacetal Resin as Major Ingredient

A fifth embodiment of the thermoplastic resin of this invention is exemplified by a case where the thermoplastic resin contains polyacetal resin. The content of the polyacetal resin, when contained, is preferably 80% by weight or more, up to the upper limit of 100% by weight. When the polyacetal resin is contained, also other resin component may be contained. The content of such other resin is, however, preferably 5% by weight or less of the total resin component.

Polyacetal Resin

Regarding the polyacetal resin, the descriptions in paragraph [0011] of JP-A-2003-003041, and paragraphs [0018] to [0020] of JP-A-2003-220667 may be referred to.

Regarding the polyphenylene sulfide resin, the descriptions in paragraphs [0014] to [0016] of JP-A-H10-292114, paragraphs [0011] to [0013] of JP-A-H10-279800, and paragraphs [0011] to [0015] of JP-A-2009-30030 may be referred to.

In the thermoplastic resin composition used in this invention, the resin component preferably accounts for 40% by weight or more of the total composition, more preferably 50% by weight or more, and even more preferably 60% by weight or more. When a fiber (for example, glass filler, etc. described later) is mixed, the fiber and the resin component in total preferably accounts for 80% by weight or more.

<<<Other Components>>>

The thermoplastic resin composition used in this invention may contain a fiber such as glass filler, or various additives, in addition to the thermoplastic resin.

The conventional thermoplastic resin composition containing the LDS additive has suffered from a problem that the LDS additive could sometimes damage the glass filler, and thereby degrade the mechanical strength inherent to the glass filler. In contrast, this invention can avoid such problem, since the LDS additive is added separately from the thermoplastic resin composition.

The conventional thermoplastic resin composition containing the LDS additive has also suffered from a problem that the plated layer could not properly be formed even mixed with the LDS additive, if a dye-pigment or fire retardant composition was mixed. Meanwhile this invention can avoid the problem, since the LDS additive is added separately from the thermoplastic resin composition.

Note that the thermoplastic resin composition used in this invention is configured to contain substantially no LDS additive. The phrase of "to contain substantially no LDS additive" means that the amount of addition of the LDS additive is not enough to assist formation of the plated layer, and is typically 0.01 parts by weight or less per 100 parts by weight of the thermoplastic resin.

Glass Filler

The thermoplastic resin composition used in this invention may contain a glass filler. The glass filler is exemplified by glass fiber, plate-like glass, glass bead and glass flake. Among them, glass fiber is preferable.

The glass filler may have any of glass compositions represented by A glass, C glass, E glass, and S glass, wherein E glass (non-alkali glass) is particularly preferable since it will not adversely affect the polycarbonate resin.

The glass fiber is an article showing a fiber-like appearance, and has a circular or polygonal cross-section when taken along a line normal to the longitudinal direction.

The glass fiber used for the thermoplastic resin composition used in this invention may be filament, or strand obtained by twisting a plurality of filaments.

Product form of the glass fiber may be any of "glass roving" which is a continuously wound filament or strand, "chopped strand" chopped into 1 to 10 mm long pieces, and "milled fiber" ground into 10 to 500 μm particles. Such glass fibers have been marketed by, and are readily available from, Asahi Fiber Glass Co., Ltd. under the trade names of "Glassron chopped strand" and "Glassron milled fiber". The glass fibers with different morphologies may be used in combination.

In this invention, also glass fibers having modified cross-sectional shape are preferable. The modified cross-sectional shape preferably has a flatness ratio of typically 1.5 to 10, preferably 2.5 to 10, more preferably 2.5 to 8, and particularly 2.5 to 5, where the flatness ratio is given by the ratio of long diameter and short diameter (D2/D1), denoting D2 as the long diameter of the cross-section normal to the longitudinal direction of fiber, and denoting D1 as the short diameter. Regarding such flattened glass, the descriptions in paragraphs [0065] to [0072] may be referred to, the content of which is incorporated into this specification.

Glass bead is a spherical article having an outer diameter of 10 to 100 μm, and is typically marketed by, and readily available from, Potters-Ballotini Co., Ltd. under the trade name of "EGB731". The glass flake is a flaky article having a thickness of 1 to 20 μm and a length of side of 0.05 to 1 mm, and is typically marketed by, and readily available from, Nippon Sheet Glass Co., Ltd. under the trade name of "Fleka".

The amount of mixing of the glass filler into the thermoplastic resin composition used in this invention, when mixed, is preferably 1 part by weight or more, more preferably 10 parts by weight or more, and even more preferably 15 parts by weight or more, per 100 parts by weight of the resin component. The upper limit value is preferably 200 parts by weight or below, and more preferably 150 parts by weight or below. Depending on applications, the amount of mixing may be 60 parts by weight or less, may further be 50 parts by weight or less, and may particularly be 20 parts by weight or less.

The thermoplastic resin composition used in this invention may contain only a single species of glass filler, or two or more species. When two or more species are contained, the total content falls within the above-described ranges. By mixing the glass filler, the mechanical strength may be improved, and also the platability tends to be improved.

Sizing Agent

The glass filler mixed to the thermoplastic resin composition used in this invention is preferably coated by a sizing agent. Types of the sizing agent is not specifically limited. Only a single species of the sizing agent may be used, or two or more species may be used in combination. The sizing agent is exemplified by polyolefinic resin, silicone resin, epoxy resin and urethane resin.

The amount of mixing of the sizing agent in the thermoplastic resin composition used in this invention is preferably 0.1 to 5.0% by weight of the glass filler, and is more preferably 0.2 to 2.0% by weight. The thermoplastic resin composition used in this invention may contain only a single species of the sizing agent, or may contain two or more species. When two or more species are contained, the total content falls in the above-described ranges.

Titanium Oxide

The thermoplastic resin composition may contain titanium oxide. The titanium oxide is exemplified by titanium monooxide (TiO), dititanium trioxide ($Ti_2O_3$), and titanium dioxide ($TiO_2$). While any of them may be used, titanium dioxide is preferable. The titanium oxide having the rutile crystal structure is preferably used.

The average primary particle size of the titanium oxide is preferably 1 μm or smaller, more preferably in the range from 0.001 to 0.5 μm, and even more preferably in the range from 0.002 to 0.1 μm. By controlling the average particle size of the titanium oxide within the above-described ranges, and by controlling the amount of mixing again within the above-described ranges, the obtainable resin molded article will have an increased whiteness and increased surface reflectivity.

The titanium oxide used here may have a treated surface. Surface treatment agent is preferably an inorganic and/or organic materials. Specific examples include metal oxides such as silica, alumina and zinc oxide; and organic materials such as silane coupling agent, titanium coupling agent, organic acid, polyol, and silicone.

The titanium oxide used here may be commercially available one. Still alternatively, the titanium oxide may be properly ground from a bulk or product having a larger average particle size, optionally classified by sieving so as to adjust the average particle size within the above-described ranges.

The amount of mixing of the titanium oxide in the thermoplastic resin composition, when mixed, is preferably 0.1 parts by weight or more per 100 parts by weight of the resin component, more preferably 1 part by weight or more, and even more preferably 3 parts by weight or more. The upper limit is preferably 80 parts by weight or below, more preferably 20 parts by weight or below, even more preferably 12 parts by weight or below, and yet more preferably 8 parts by weight or below.

The thermoplastic resin composition may contain only a single species of titanium oxide, or two or more species. When two or more species are used, the total content falls within the above-described ranges.

Elastomer

The thermoplastic resin composition used in this invention may contain an elastomer. By containing the elastomer, the obtainable resin molded article will have an improved impact resistance. The elastomer used in this invention is exemplified by styrene-butadiene-based triblock copolymers called methyl methacrylate-butadiene-styrene copolymer (MBS resin), SBS or SEBS, and hydrogenated products thereof; styrene-isoprene-based triblock copolymers called SPS or SEPS, and hydrogenated products thereof; olefinic thermoplastic elastomer called TPO; polyester-based elastomer; siloxane-based rubber; and acrylate-based rubber. As the elastomer, those described in paragraphs [0075] to [0088] of JP-A-2012-251061, and those described in paragraphs [0101] to [0107] of JP-A-2012-177047 may be used, the contents of which are incorporated into the specification of the present application.

The elastomer used in this invention preferably has the content of acrylonitrile/butadiene/styrene copolymer of less than 10% by weight of the total, more preferably 5% by weight or less, and even more preferably 3% by weight or less.

The elastomer used in this invention is preferably a graft copolymer composed of a rubber component grafted with a monomer component copolymerizable therewith. The graft copolymer may be manufactured by any of the methods including bulk polymerization, solution polymerization, suspension polymerization, and emulsion polymerization. The style of copolymerization may either be single-stage grafting or multi-stage grafting.

The rubber component preferably has a glass transition temperature of typically 0° C. or lower, preferably −20° C. or lower, and more preferably −30° C. or lower. Specific examples of the rubber component include polybutadiene rubber; polyisoprene rubber; polyalkyl acrylate rubbers such as polybutyl acrylate, poly(2-ethylhexyl acrylate), and butyl acrylate/2-ethylhexyl acrylate copolymer; silicone rubbers such as polyorganosiloxane rubber; butadiene-acryl composite rubber; IPN (Interpenetrating Polymer Network)-type composite rubber composed of polyorganosiloxane rubber and polyalkyl acrylate rubber; styrene-butadiene rubber; ethylene-α-olefinic rubbers such as ethylene-propylene rubber, ethylene-butene rubber and ethylene-octene rubber; ethylene-acrylic rubber; and fluorine-containing rubber. They may be used independently, or in a mixed form of two or more species. Among them, in view of mechanical characteristics and appearance of the surface, preferable are polybutadiene rubber, polyalkyl acrylate rubber, polyorganosiloxane rubber, IPN-type composite rubber composed of polyorganosiloxane rubber and polyalkyl acrylate rubber, and styrene-butadiene rubber.

Specific examples of the monomer component possibly polymerized by grafting with the rubber component include aromatic vinyl compound; cyanated vinyl compound; (meth)acrylate ester compound; (meth)acrylic acid compound; epoxy group-containing (meth)acrylate ester compound such as glycidyl (meth)acrylate; maleimide compounds such as maleimide, N-methylmaleimide and N-phenylmaleimide; and α,β-unsaturated carboxylic acid compound such as maleic acid, phthalic acid and itaconic acid, and anhydrides thereof (e.g., maleic anhydride, etc.). These monomer component may be used independently, or in a mixed form of two or more species. Among them, in view of mechanical characteristics and appearance of the surface, preferable are aromatic vinyl compound, cyanated vinyl compound, (meth)acrylate ester compound and (meth)acrylic acid compound, and more preferable is (meth)acrylate ester compound. Specific examples of the (meth)acrylate ester compound include methyl (meth)acrylate, ethyl (meth)acrylate, butyl (meth)acrylate, cyclohexyl (meth)acrylate, and octyl (meth)acrylate.

The graft copolymer copolymerized with the rubber component is preferably a core/shell-type graft copolymer, in view of impact resistance and appearance of the surface. Among them, particularly preferable is a core/shell-type graft copolymer having a core layer composed of at least one species of rubber component selected from polybutadiene-containing rubber, polybutyl acrylate-containing rubber, polyorganosiloxane rubber, and IPN-type composite rubber composed of polyorganosiloxane rubber and polyalkyl acrylate rubber; and a shell layer formed therearound by copolymerizing a (meth)acrylate ester. The core/shell-type graft copolymer preferably contains 40% by weight or more, and more preferably 60% by weight or more of rubber component. The copolymer also preferably contains 10% by weight or more of (meth)acrylic acid. Note that the core/shell structure in this invention need not always have a core layer and a shell layer clearly separable from each other, but is broadly construed to include compounds obtained by grafting the rubber component around the core portion.

Preferable examples of the core/shell-type graft copolymer include methyl methacrylate-butadiene-styrene copolymer (MBS), methyl methacrylate-acrylonitrile-butadiene-styrene copolymer (MABS), methyl methacrylate-butadiene copolymer (MB), methyl methacrylate-acrylic rubber copolymer (MA), methyl methacrylate-acrylic rubber-styrene copolymer (MAS), methyl methacrylate-acrylate-butadiene rubber copolymer, methyl methacrylate-acrylate-butadiene rubber-styrene copolymer, methyl methacrylate-(acrylate-silicone IPN rubber) copolymer, and silicone-acrylate composite rubber containing polyorganosiloxane and polyalkyl (meth)acrylate, wherein silicone-acrylate composite rubber containing polyorganosiloxane and polyalkyl (meth)acrylate, and methyl methacrylate-butadiene copolymer (MB) are particularly preferable. Such rubbery polymer may be used independently, or in a mixed form of two or more species.

Such elastomer is exemplified by "Paraloid (registered trademark, the same shall apply hereinafter) EXL2602", "Paraloid EXL2603", "Paraloid EXL2655", "Paraloid EXL2311", "Paraloid EXL2313", "Paraloid EXL2315", "Paraloid KM330", "Paraloid KM336P" and "Paraloid KCZ201" from Rohm and Haas Japan K.K.; "Metablen (registered trademark, the same shall apply hereinafter) C-223A", "Metablen E-901", "Metablen S-2001", "Metablen SRK-200" and "Metablen S-2030" from Mitsubishi Rayon Co., Ltd.; "Kane Ace (registered trademark, the same shall apply hereinafter) M-511", "Kane Ace M-600", "Kane Ace M-400", "Kane Ace M-580", "Kane Ace M-711" and "Kane Ace MR-01" from Kaneka Corporation; and "UBESTA XPA" from Ube Industries, Ltd.

The amount of mixing of the elastomer, when mixed, is preferably 1 to 20 parts by weight, more preferably 1 to 15 parts by weight, and even more preferably 2 to 10 parts by weight, per 100 parts by weight of the resin component.

The thermoplastic resin composition used in this invention may contain only a single species of the elastomer, or two or more species. When two or more species are contained, the total content falls within the above-described ranges.

Fire Retardant Composition

The thermoplastic resin composition used in this invention may contain a fire retardant composition. The fire retardant composition may be composed of a fire retardant, or may be a combination of a fire retardant and a fire retardant auxiliary. Each of the fire retardant and the fire retardant auxiliary may be of a single species, or of two or more species.

The fire retardant and/or fire retardant auxiliary contained in the fire retardant composition in this invention is exemplified by halogen-containing fire retardant, organometallic salt-based fire retardant, phosphorus-containing fire retardant, silicone-based fire retardant, and antimony-containing fire retardant or fire retardant auxiliary. When polyamide resin or polyester resin is used as the thermoplastic resin, it is preferable to mix the halogen-containing fire retardant or phosphorus-containing fire retardant. Meanwhile when polycarbonate resin is used as the thermoplastic resin, it is preferable to use phosphorus-containing fire retardant or organometallic salt-based fire retardant.

Preferred specific examples of the halogen-containing fire retardant include bromine-containing fire retardants, which are exemplified by brominated polycarbonate, brominated epoxy resin, brominated phenoxy resin, brominated polyphenylene ether resin, brominated polystyrene resin, brominated bisphenol A, glycidyl brominated bisphenol A, pentabromobenzyl polyacrylate, and brominated imide. Among them, brominated polycarbonate, brominated polystyrene resin, glycidyl brominated bisphenol A, and pentabromobenzyl polyacrylate are more preferable in view of their tendency to suppress the impact resistance from degrading.

The phosphorus-containing fire retardant is exemplified by metal ethylphosphinate salt, metal diethylphosphinate salt, melamine polyphosphate, phosphate ester, and phosphazene. Among them, metal diethylphosphinate salt, melamine polyphosphate, and phosphazene are preferable in view of their thermal stability. In order to suppress outgas or mold deposit during molding, or to suppress bleed-out of the fire retardant, it is also preferable to mix a thermoplastic resin that is highly compatible with the phosphorus-containing fire retardant. This sort of thermoplastic resin is preferably polyphenylene ether resin, polycarbonate resin, or styrene-based resin.

The organometallic salt-based fire retardant is preferably organic alkali metal salt compound or organic alkali earth metal salt compound (alkali metal and alkali earth metal will be referred to as "alkali (earth) metal", hereinafter). The organometallic salt-based fire retardant is exemplified by metal sulfonate salt, metal carboxylate salt, metal borate salt, and metal phosphate salt. In view of thermal stability when added to the aromatic polycarbonate resin, preferable is metal sulfonate salt, and particularly preferable is metal perfluoroalkanesulfonate salt.

The metal sulfone salt is exemplified by lithium (Li) sulfonate salt, sodium (Na) sulfonate salt, potassium (K) sulfonate salt, rubidium (Rb) sulfonate salt, cesium (Cs) sulfonate salt, magnesium (Mg) sulfonate salt, calcium (Ca) sulfonate salt, strontium (Sr) sulfonate salt, and barium (Ba) sulfonate salt. Among them, sodium (Na) sulfonate salt and potassium (K) sulfonate salt are particularly preferable.

Such sulfonic acid metal salt is exemplified by alkali (earth) metal salt compound of aromatic sulfonic acid such as dipotassium diphenylsulfone-3,3'-disulfonate, potassium diphenylsulfone-3-sulfonate, sodium benzenesulfonate, sodium (poly)styrenesulfonate, sodium paratoluenesulfonate, sodium (branched) dodecylbenzenesulfonate, sodium trichlorobenzenesulfonate, potassium benzenesulfonate, potassium styrenesulfonate, potassium (poly)styrenesulfonate, potassium paratoluenesulfonate, potassium (branched) dodecylbenzenesulfonate, potassium trichlorobenzenesulfonate, cesium benzenesulfonate, cesium (poly)styrenesulfonate, cesium paratoluenesulfonate, cesium (branched) dodecylbenzenesulfonate, and cesium trichlorobenzenesulfonate; and metal salt of perfluoroalkanesulfonic acid (alkane preferably has 2 to 6 carbon atoms) such as alkali metal salt of perfluoroalkanesulfonate such as potassium perfluorobutanesulfonate. Among them, dipotassium diphenylsulfone-3,3'-disulfonate, potassium diphenylsulfone-3-sulfonate, sodium paratoluenesulfonate, potassium paratoluenesulfonate, and potassium perfluorobutanesulfonate are preferable in view of a good balance between translucency and fire retardancy. Metal salt of perfluoroalkanesulfonic acid such as potassium perfluorobutanesulfonate is particularly preferable.

Antimony-containing fire retardant or fire retardant auxiliary is a compound that contains antimony and contributes to fire retardancy. Specific examples include antimony oxides such as antimony trioxide ($Sb_2O_3$), antimony tetraoxide and antimony pentaoxide ($Sb_2O_5$); sodium antimonate; and antimony phosphate. Among them, antimony oxides are preferable by virtue of their good moist heat resistance. Antimony trioxide is more preferably used.

The fire retardant auxiliary, other than those described above, is exemplified by copper oxide, magnesium oxide, zinc oxide, molybdenum oxide, zirconium oxide, tin oxide, iron oxide, titanium oxide, aluminum oxide, and zinc borate. Among them, zinc borate is preferable in view of its good fire retardancy.

The ratio of content of fire retardant auxiliary is preferably 0.3 to 1.1 (ratio by weight), and more preferably 0.4 to 1.0, relative to the fire retardant.

In particular, as the fire retardant composition used in this invention, exemplified is a combination of a halogen-containing fire retardant and an antimony-containing fire retardant or fire retardant auxiliary. The present inventors have found from our investigations that the resin composition containing the LDS additive, when mixed with the antimony-containing fire retardant or fire retardant auxiliary, sometimes failed in properly forming the plated layer. The antimony-containing fire retardant or fire retardant auxiliary is, however, useful as a fire retardant for thermoplastic resin, so that there is a need for properly form the plated layer on the thermoplastic resin molded article that contains the antimony-containing fire retardant or fire retardant auxiliary. This invention now succeeded in properly forming the plated layer on the surface of the resin molded article, by using the LDS layer-forming composition separately from the thermoplastic resin composition even if it contains the antimony-containing fire retardant or fire retardant auxiliary.

The content of antimony-containing fire retardant or fire retardant auxiliary, when contained, is preferably 0.1 to 25 parts by weight, and more preferably 1 to 15 parts by weight, per 100 parts by weight of the thermoplastic resin.

When the antimony-containing fire retardant or fire retardant auxiliary is used, the ratio of content is preferably 1:0.3 to 1.1 (ratio by weight), and more preferably 1:0.4 to 1.0.

The amount of mixing of the fire retardant composition, per 100 parts by weight of the resin component, is preferably 0.01 parts by weight to 40 parts by weight, more preferably 1 to 40 parts by weight, even more preferably 5 to 50 parts by weight, particularly 6 to 35 parts by weight, and more particularly 7 to 30 parts by weight. Addition of the fire retardant composition to the thermoplastic resin composition already containing the LDS additive has sometimes resulted in degradation of the platability (appearance of plating). In contrast, this invention can properly form the plated layer also on the surface of the resin molded article preliminarily mixed with the fire retardant composition, since the thermoplastic resin composition and the LDS layer-forming composition are used separately.

In particular for the case of using an organometallic salt-based fire retardant as the fire retardant composition, the content thereof is preferably 0.01 to 1 part by weight per 100 parts by weight of the resin component.

Antidripping Agent

The thermoplastic resin composition used in this invention may contain an antidripping agent. The antidripping agent is preferably polytetrafluoroethylene (PTFE), which has a fibril-forming ability, easily dispersible into the resin composition, and shows tendency of binding resins to form a fibrous material. Specific examples of polytetrafluoroethylene include "Teflon (registered trademark) 6J" or "Teflon (registered trademark) 30J" commercially available from Du Pont-Mitsui Fluorochemicals Company, Ltd.; "Polyflon" commercially available from Daikin Industries, Ltd.; and "Fluon" commercially available from Asahi Glass Co., Ltd.

The ratio of content of the antidripping agent is preferably 0.01 to 20 parts by weight per 100 parts by weight of the thermoplastic resin. By controlling the content of the antidripping agent to 0.1 parts by weight or above, the fire retardancy tends to be improved, meanwhile by controlling the content to 20 parts by weight or below, the appearance tends to improve. The ratio of content of the antidripping agent is more preferably 0.05 to 10 parts by weight, and even more preferably 0.08 to 5 parts by weight, per 100 parts by weight of the thermoplastic resin.

Silicate Mineral

The thermoplastic resin composition used in this invention may contain a silicate mineral. By mixing the silicate mineral in this invention, the notched Charpy impact strength may be improved. The silicate mineral is not specifically limited so long as it contains silicon (Si) and oxygen (O), and is preferably talc and/or mica, and more preferably talc.

The silicate mineral used in this invention is preferably in a particle form, preferably having an average particle size of 1 to 30 μm, and more preferably 2 to 20 μm.

The silicate mineral used in this invention may be a silicate mineral whose surface is treated with at least one compound selected from polyorganohydrogen siloxanes and organopolysiloxanes, wherein the surface is preferably not treated.

The amount of mixing of the silicate mineral, when mixed, is preferably 0.1 parts by weight or more per 100 parts by weight of the resin component, more preferably 1 part by weight or more, even more preferably 3 parts by weight or more, particularly 3.5 parts by weight or more, and even may be 4.0 parts by weight or more. The upper limit value is preferably 30 parts by weight or below, more preferably 20 parts by weight or below, particularly 10 parts by weight or below, or alternatively be 9 parts by weight or below, and even may be 8 parts by weight or below.

The thermoplastic resin composition used in this invention may contain only a single species of silicate mineral, or may contain two or more species. When two or more species are contained, the total content is controlled within the above-described ranges. When the silicate mineral has a treated surface, the amount including the surface treatment agent preferably falls within the above-described ranges.

Dye-Pigment

The thermoplastic resin composition used in this invention may contain a dye-pigment other than titanium oxide. In this invention, addition of the dye-pigment can color the resin molded article.

The dye-pigment is exemplified by white pigment containing ZnS or ZnO, and black dye-pigment (in particular, black pigment) such as carbon black. In particular, by mixing the black dye-pigment, the black dye-pigment absorbs heat of laser irradiation to thereby melt the surface of the resin molded article composed of the thermoplastic resin composition, and thereby the adhesiveness with the LDS additive may be improved.

The dye-pigment is also exemplified by phthalocyanine-based dye-pigment such as copper phthalocyanine blue, and copper phthalocyanine green; azo-based dye-pigment such as nickel azo yellow; condensed polycyclic dye-pigment such as thioindigo-based, perinone-based, perylene-based, quinacridone-based, dioxazine-based, isoindolinone-based, and quinophthalone-based ones; and anthraquinone-based, heterocyclic-based and methyl dye-pigment.

Addition of the dye-pigment to the thermoplastic resin composition preliminarily added with the LDS additive has sometimes degraded the platability. In contrast according to this invention, the plated layer may properly be formed also on the surface of the resin molded article composed of the thermoplastic resin composition containing the pigment, since the thermoplastic resin composition and the LDS layer-forming composition are used separately. In particular, this invention is effective, since the platability has been likely to be damaged when white pigment was used.

When the thermoplastic resin composition used in this invention contains a pigment, the amount of addition of dye-pigment is preferably 0.1 to 40 parts by weight per 100 parts by weight of resin component, and more preferably 0.3 to 30 parts by weight.

The thermoplastic resin composition used in this invention may contain only a single species of dye-pigment, or two or more species. When two or more species are contained, the total content preferably falls within the above-described ranges.

Phosphorus-Containing Stabilizer

The thermoplastic resin composition used in this invention preferably contains a phosphorus-containing stabilizer. The phosphorus-containing stabilizer is preferably phosphate ester and phosphite ester.

The phosphate ester is preferably a compound represented by Formula (3) below:

Formula (3)

$$O=P(OH)_m(OR)_3 \tag{3}$$

(in Formula (3), R represents an alkyl group or aryl group, where individual (R)s may be same or different. m represents an integer of 0 to 2.)

R preferably represents an alkyl group having 1 to 30 carbon atoms, or an aryl group having 6 to 30 carbon atoms, and more preferably represents an alkyl group having 2 to 25 carbon atoms, phenyl group, nonylphenyl group, stearylphenyl group, 2,4-di-tert-butylphenyl group, 2,4-di-tert-butylmethylphenyl group, or tolyl group.

The phosphate ester is exemplified by trimethyl phosphate, triethyl phosphate, tributyl phosphate, trioctyl phosphate, triphenyl phosphate, tricresyl phosphate, tris(nonylphenyl) phosphate, 2-ethylphenyldiphenyl phosphate, and tetrakis(2,4-di-tert-butylphenyl)-4,4-diphenylene phosphonite.

The phosphite ester is preferably a compound represented by Formula (4) below:

Formula (4)
[Chemical Formula 1]

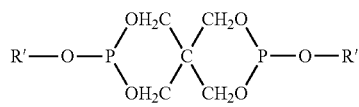

(4)

(in Formula (4), R' represents an alkyl group or aryl group, where the individual (R')s may be same or different.)

R' preferably represents an alkyl group having 1 to 25 carbon atoms, or an aryl group having 6 to 12 carbon atoms. When R' represents an alkyl group, it is preferably an alkyl group having 1 to 30 carbon atoms. When R' represents an aryl group, it is preferably an aryl group having 6 to 30 carbon atoms.

The phosphite ester is exemplified by triesters, diesters and monoesters of phosphonic acid such as triphenyl phosphite, trisnonylphenyl phosphite, tris(2,4-di-tert-butylphenyl) phosphite, trinonyl phosphite, tridecyl phosphite, trioctyl phosphite, trioctadecyl phosphite, distearylpentaerythritol diphosphite, tricyclohexyl phosphite, monobutyldiphenyl phosphite, monooctyldiphenyl phosphite, bis(2,4-di-tert-butylphenyl)pentaerythritol phosphite, bis(2,6-di-tert-butyl-4-methylphenyl)pentaerythritol phosphite, and 2,2-methylenebis(4,6-di-tert-butylphenyl)octyl phosphite.

The amount of mixing of the phosphorus-containing stabilizer, when contained in the thermoplastic resin composition used in this invention, is preferably 0.01 to 5 parts by weight per 100 parts by weight of the resin component, and more preferably 0.02 to 2 parts by weight.

The thermoplastic resin composition used in this invention may contain only a single species of phosphorus-containing stabilizer, or two or more species. When two or more species are contained, the total content falls within the above-described ranges.

Antioxidant

The thermoplastic resin composition used in this invention may contain an antioxidant. The antioxidant is preferably a phenolic antioxidant, and more specifically exemplified by 2,6-di-t-butyl-4-methylphenol, n-octadecyl-3-(3,5-di-t-butyl-4-hydroxyphenyl) propionate, tetrakis[methylene-3-(3,5-di-t-butyl-4-hydroxyphenyl) propionate]methane, tris(3,5-di-t-butyl-4-hydroxybenzyl)isocyanurate, 4,4'-butylidenebis(3-methyl-6-t-butylphenol), triethylene glycol-bis[3-(3-t-butyl-hydroxy-5-methylphenyl) propionate], 3,9-bis{2-[3-(3-t-butyl-4-hydroxy-5-methylphenyl) propionyloxy]-1,1-dimethylethyl}-2,4,8,10-tetraoxaspiro[5.5]undecane, N,N'-hexamethylenebis[3-(3,5-di-t-butyl-4-(-hydroxyphenyl)propion amide), and pentaerythritol tetrakis[3-(3,5-di-tert-butyl-4-hydroxyphenyl) propionate]. Among them, preferable are octadecyl-3-(3,5-di-tert-butyl-4-hydroxyphenyl) propionate, N,N'-hexamethylenebis[3-(3,5-di-t-butyl-4-(hydroxyphenyl)propion amide), and pentaerythritol tetrakis[3-(3,5-di-tert-butyl-4-hydroxyphenyl) propionate].

The amount of mixing of the antioxidant, when contained in the thermoplastic resin composition used in this invention, is 0.01 to 5 parts by weight per 100 parts by weight of the resin component, and more preferably 0.05 to 3 parts by weight.

The thermoplastic resin composition used in this invention may contain only a single species of antioxidant, or two or more species. When two or more species are contained, the total content falls within the above-described ranges.

Hydrolysis Resistance Modifier

The thermoplastic resin composition used in this invention may contain a hydrolysis resistance modifier. The hydrolysis resistance modifier is beneficial in particular when a polyester resin is contained as the thermoplastic resin. The hydrolysis resistance modifier employed here may be any of known compounds, and is exemplified by carbodiimide compound, epoxy compound, oxazoline compound and oxazine compound.

The carbodiimide compound used as the hydrolysis resistance modifier in this invention has at least two carbodiimide groups (—N=C=N—) in one molecule, and may be manufactured typically by subjecting a polyfunctional isocyanate compound, having at least two isocyanate groups in one molecule, to decarbonation condensation (carbodiimidation reaction), under the presence of a carbodiimidation catalyst. The carbodiimidation reaction may be allowed to proceed by any of known methods. More specifically, the condensation associated by decarbonization (carbodiimidation reaction) may be allowed to proceed in such a way that an isocyanate is dissolved into an inert solvent, or kept in a solvent-less state under flow or under bubbling of nitrogen gas or other inert gas, a carbodiimidation catalyst such as an organic phosphorus-containing compound, represented by phosphorene oxide, is added, and the mixture is then heated and stirred within the temperature range of 150 to 200° C.

Although bifunctional isocyanate having two isocyanate groups in one molecule is particularly preferable as the polyfunctional isocyanate compound, it is also possible to use an isocyanate compound having three or more isocyanate groups in combination with the diisocyanate. The polyfunctional isocyanate compound may alternatively be any of aliphatic isocyanate, alicyclic isocyanate and aromatic isocyanate. Specific examples of the polyfunctional isocyanate include, but not limited to, hexamethylene diisocyanate (HDI), hydrogenated xylylene diisocyanate (H6XDI), xylylene diisocyanate (XDI), 2,2,4-trimethylhexamethylene diisocyanate (TMHDI), dodecane 1,12-diisocyanate (DDI), norbornane diisocyanate (NBDI), 2,4-bis-(8-isocyanatooctyl)-1,3-dioctyl cyclobutane (OCDI), 4,4'-dicyclohexylmethane diisocyanate (HMDI), tetramethylxylylene diisocyanate (TMHDI), isophorone diisocyanate (IPDI), 2,4,6-triisopropylphenyl diisocyanate (TIDI), 4,4'-diphenylmethane diisocyanate (MDI), tolylene diisocyanate (TDI), and hydrogenated tolylene diisocyanate (HTDI).

The carbodiimide compound suitably used in this invention is a carbodiimide compound derived from HMDI or MDI, or may be commercially available "Carbodilite" (from Nisshinbo Chemical Inc.), or "Stabaxol P" (from Rhein Chemie Japan Ltd.).

The epoxy compound used as the hydrolysis resistance modifier in this invention is exemplified by bisphenol A-type epoxy compound, bisphenol F-type epoxy compound, resorcin-type epoxy compound, novolac-type epoxy compound, alicyclic compound-type diepoxy compound, glycidyl ethers and epoxylated polybutadiene, and is more specifically by bisphenol A-type epoxy compound, bisphenol F-type epoxy compound, resorcin-type epoxy compound, novolac-type epoxy compound, and alicyclic compound-type epoxy compounds such as vinylcyclohexene dioxide and dicyclopentadiene oxide. In view of chemical resistance and dispersibility into resin, the epoxy compound more preferably used is a novolac-type epoxy resin having an epoxy equivalent of 150 to 280 g/eq, or bisphenol A-type epoxy resin having an epoxy equivalent of 600 to 3000 g/eq. More preferable examples include a novolac-type epoxy resin having an epoxy equivalent of 180 to 250 g/eq and a molecular weight of 1000 to 6000, or a bisphenol A-type epoxy resin having an epoxy equivalent of 600 to 3000 g/eq and a molecular weight of 1200 to 6000. The values of epoxy equivalent and molecular weight employed here are catalog values.

The compound having an oxazoline group (ring) is exemplified by oxazoline, alkyl oxazoline ($C_{1-4}$ alkyl oxazolines such as 2-methyloxazoline and 2-ethylazoline), and bisoxazoline compound. The bisoxazoline compound is exemplified by 2,2'-bis(2-oxazoline); 2,2'-bis(alkyl-2-oxazoline) [2,2'-bis($C_{1-6}$ alkyl-2-oxazoline), etc. such as 2,2'-bis(4-methyl-2-oxazoline), 2,2'-bis(4-ethyl-2-oxazoline) and 2,2'-bis(4,4-dimethyl-2-oxazoline)]; 2,2'-bis(aryl-2-oxazoline) [2,2'-bis(4-phenyl-2-oxazoline), etc.]; 2,2'-bis(cycloalkyl-2-oxazoline) [2,2'-bis(4-cyclohexyl-2-oxazoline), etc.]; 2,2'-bis(aralkyl-2-oxazoline) [2,2'-bis(4-benzyl-2-oxazoline), etc.]; 2,2'-alkylene bis(2-oxazoline) [2,2'-$C_{1-10}$ alkylene bis(2-oxazoline), etc. such as 2,2'-ethylenebis(2-oxazoline) and 2,2'-tetramethylenebis(2-oxazoline)]; 2,2'-alkylenebis(alkyl-2-oxazoline) [2,2'-$C_{1-10}$ alkylene bis($C_{1-6}$ alkyl-2-oxazoline), etc. such as 2,2'-ethylenebis(4-methyl-2-oxazoline) and 2,2'-tetramethylenebis(4,4-dimethyl-2-oxazoline)]; 2,2'-arylenebis(2-oxazoline) [2,2'-diphenylenebis(2-oxazoline), etc. such as 2,2'-(1,3-phenylene)-bis(2-oxazoline), 2,2'-(1,4-phenylene)-bis(2-oxazoline), 2,2'-(1,2-phenylene)-bis(2-oxazoline), and 2,2'-diphenylenebis(2-oxazoline)]; 2,2'-arylenebis(alkyl-2-oxazoline) [2,2'-phenylene-bis($C_{1-6}$ alkyl-2-oxazoline), etc. such as 2,2'-(1,3-phenylene)-bis(4-methyl-2-oxazoline) and 2,2'-(1,4-phenylene)-bis(4,4-dimethyl-2-oxazoline)]; 2,2'-aryloxyalkanebis(2-oxazoline) [2,2'-9,9'-diphenoxyethanebis(2-oxazoline), etc.]; 2,2'-cycloalkylene bis(2-oxazoline) [2,2'-cyclohexylenebis(2-oxazoline), etc.]; N,N'-alkylenebis(2-carbamoyl-2-oxazoline) [N,N'—$C_{1-10}$ alkylenebis(2-carbamoyl-2-oxazoline), etc. such as N,N'-ethylenebis(2-carbamoyl-2-oxazoline) and N,N'-tetramethylenebis(2-carbamoyl-2-oxazoline)]; N,N'-alkylenebis(2-carbamoyl-alkyl-2-oxazoline) [N,N'—$C_{1-10}$ alkylene bis(2-carbamoyl-$C_{1-6}$ alkyl-2-oxazoline), etc. such as N,N'-ethylenebis(2-carbamoyl-4-methyl-2-oxazoline) and N,N'-tetramethylenebis(2-carbamoyl-4,4-dimethyl-2-oxazoline)]; and N,N'-arylenebis(2-carbamoyl-2-oxazoline) [N,N'-phenylenebis(2-carbamoyl-oxazoline), etc.]. The compound having an oxazoline group also includes vinyl polymers having oxazoline groups [Epocros RPS Series, RAS Series and RMS Series, etc., all from Nippon Shokubai Co., Ltd.,]. Among these oxazoline compounds, bisoxazoline compound is preferable.

The compound having an oxazine group (ring) is exemplified by oxazine and bisoxazine compound. The bisoxazine compound is exemplified by 2,2'-bis(5,6-dihydro-4H-1,3-oxazine); 2,2'-bis(alkyl-5,6-dihydro-4H-1,3-oxazine) [2,2'-bis($C_{1-6}$ alkyl-5,6-dihydro-4H-1,3-oxazine), etc., such as 2,2'-bis(4-methyl-5,6-dihydro-4H-1,3-oxazine), 2,2'-bis (4,4-dimethyl-5,6-dihydro-4H-1,3-oxazine) and 2,2'-bis(4,5-dimethyl-5,6-dihydro-4H-1,3-oxazine)]; 2,2'-alkylenebis (5,6-dihydro-4H-1,3-oxazine) [2,2'-$C_{1-10}$ alkylenebis(5,6-dihydro-4H-1,3-oxazine), etc., such as 2,2'-methylenebis(5,6-dihydro-4H-1,3-oxazine), 2,2'-ethylenebis(5,6-dihydro-4H-1,3-oxazine) and 2,2'-hexanemethylenebis(5,6-dihydro-4H-1,3-oxazine)]; 2,2'-arylenebis(5,6-dihydro-4H-1,3-oxazine) [2,2'-(1,3-phenylene)-bis(5,6-dihydro-4H-1,3-oxazine), 2,2'-(1,4-phenylene)-bis(5,6-dihydro-4H-1,3-oxazine), 2,2'-(1,2-phenylene)-bis(5,6-dihydro-4H-1,3-oxazine), 2,2'-naphthylenebis(5,6-dihydro-4H-1,3-oxazine), 2,2'-diphenylenebis(5,6-dihydro-4H-1,3-oxazine), etc.]; N,N'-alkylenebis(2-carbamoyl-5,6-dihydro-4H-1,3-oxazine) [N,N'—$C_{1-10}$ alkylenebis(2-carbamoyl-5,6-dihydro-4H-1,3-oxazine), etc., such as N,N'-ethylenebis(2-carbamoyl-5,6-dihydro-4H-1,3-oxazine) and N,N'-tetramethylenebis(2-carbamoyl-5,6-dihydro-4H-1,3-oxazine)]; N,N'-alkylene bis(2-carbamoyl-alkyl-5,6-dihydro-4H-1,3-oxazine) [N,N'—$C_{1-10}$ alkylene bis(2-carbamoyl-$C_{1-6}$ alkyl-5,6-dihydro-4H-1,3-oxazine), etc., such as N,N'-ethylenebis(2-carbamoyl-4-methyl-5,6-dihydro-4H-1,3-oxazine) and N,N'-hexamethylenebis(2-carbamoyl-4,4-dimethyl-5,6-dihydro-4H-1, 3-oxazine)]; and N,N'-arylenebis(2-carbamoyl-5,6-dihydro-4H-1,3-oxazine) [N,N'-phenylenebis(2-carbamoyl-oxazine), etc.]. Among these oxazine compounds, bisoxazine compound is preferable.

The amount of mixing of the hydrolysis resistance modifier, when mixed, is preferably 0.05 to 3 parts by weight per 100 parts by weight of the thermoplastic resin, and more preferably 0.1 to 2 parts by weight.

Mold Releasing Agent

The thermoplastic resin composition used in this invention may contain a mold releasing agent. The mold releasing agent is preferably at least one compound selected from aliphatic carboxylic acid, aliphatic carboxylic acid ester, aliphatic hydrocarbon compound having a number average molecular weight of 200 to 15000 and polyolefinic compound. Among them, at least one compound selected from polyolefinic compound, aliphatic carboxylic acid, and aliphatic carboxylic acid ester is preferably used.

The aliphatic carboxylic acid is exemplified by saturated or unsaturated, aliphatic monocarboxylic acid, dicarboxylic acid and tricarboxylic acid. In this specification, the term "aliphatic carboxylic acid" is used to encompass alicyclic carboxylic acid. Among the aliphatic carboxylic acid, preferable is mono or dicarboxylic acid having 6 to 36 carbon atoms, and more preferable is aliphatic saturated monocarboxylic acid having 6 to 36 carbon atoms. Specific examples of such aliphatic carboxylic acid include palmitic acid, stearic acid, valeric acid, caproic acid, capric acid, lauric acid, arachic acid, behenic acid, lignoceric acid, cerotic acid, melissic acid, tetratriacontanoic acid, montanic acid, glutaric acid, adipic acid and azelaic acid.

The aliphatic carboxylic acid component used for composing the aliphatic carboxylic acid ester may be same as the above-described aliphatic carboxylic acid. Meanwhile, the alcohol component for composing the aliphatic carboxylic acid ester may be exemplified by saturated or unsaturated monohydric alcohol, and saturated or unsaturated polyhydric alcohol. These alcohols may have a substituent such as fluorine atom or aryl group. Among these alcohols, preferable is monohydric or polyhydric saturated alcohol having 30 or smaller number of carbon atoms, and more preferable is aliphatic saturated monohydric or polyhydric alcohol having 30 or smaller number of carbon atoms. The aliphatic alcohol encompasses alicyclic alcohol. Specific examples of these alcohols include octanol, decanol, dodecanol, stearyl alcohol, behenyl alcohol, ethylene glycol, diethylene glycol, glycerin, pentaerythritol, 2,2-dihydroxyperfluoropropanol, neopentylene glycol, ditrimethylolpropane, and dipentaerythritol. These aliphatic carboxylic acid esters may contain aliphatic carboxylic acid and/or alcohol as an impurity, and may be a mixture of a plurality of compounds. Specific examples of the aliphatic carboxylic acid ester include beeswax (a mixture containing myricyl palmitate as a major constituent), stearyl stearate, behenyl behenate, octyldodecyl behenate, glycerin monopalmitate, glycerin monostearate, glycerin distearate, glycerin tristearate, pentaerythritol monopalmitate, pentaerythritol monostearate, pentaerythritol distearate, pentaerythritol tristearate, and pentaerythritol tetrastearate.

The polyolefinic compound is exemplified by a compound selected from paraffin wax and polyethylene wax, among which polyethylene wax having a weight average molecular weight of 700 to 10,000, and particularly 900 to 8,000, is preferable, taking a good dispersibility of the polyolefinic compound into consideration.

The amount of mixing of the mold releasing agent, when contained in the thermoplastic resin composition used in this invention, is 0.01 to 5 parts by weight, and more preferably 0.05 to 3 parts by weight per 100 parts by weight of the resin component. The thermoplastic resin composition used in this invention may contain a single species of the mold releasing agent, or may contain two or more species. When two or more species are contained, the total content falls within the above-described ranges.

The thermoplastic resin composition used in this invention may contain other component without departing from the spirit of this invention. Such other component is exemplified by stabilizers other than the phosphorus-containing stabilizer, UV absorber, inorganic filler other than those described above, white pigment other than titanium oxide, fluorescent brightener, antidripping agent, antistatic agent, anticlouding agent, lubricant, antiblocking agent, fluidity modifier, plasticizer, dispersing agent, and antimicrobial agent. These compounds may be used independently, or two or more compounds may be used in combination.

Regarding these components, the descriptions in JP-A-2007-314766, JP-A-2008-127485, JP-A-2009-51989 and JP-A-2012-72338 may be referred to, the contents of which are incorporated into this specification.

<Method for Manufacturing Thermoplastic Resin Composition and Method for Manufacturing Resin Molded Article>

Methods of manufacturing the thermoplastic resin composition used in this invention are widely selectable, without special limitation, from known methods of manufacturing the thermoplastic resin composition. More specifically, the resin composition may be manufacture by preliminarily mixing the individual components using any of various types of mixers such as tumbler, Henschel mixer or the like, and then melt-kneading the mixture using a Banbury mixer, roll mixer, Brabender mixer, single-screw kneader extruder, twin-screw kneader extruder, kneader or the like.

Alternatively, the thermoplastic resin composition may be manufactured by putting the individual components, without being preliminarily mixed or only partially mixed, through a feeder into an extruder, and then melt-kneading them.

Still alternatively, the thermoplastic resin composition may be manufactured by preliminarily mixing a part of components and feeding the mixture to an extruder for melt-kneading, mixing the thus-obtained resin composition as a master batch into the residual component(s), and again melt-kneading the mixture.

Methods of manufacturing the resin molded article from the thermoplastic resin composition is not specifically limited, and any of molding methods having widely been used for thermoplastic resin, including typical injection molding, ultra-high-speed injection molding, injection compression molding, two color molding, hollow molding such as gas-assisted molding, molding using heat insulation dies, molding using rapid heating dies, foam molding (including supercritical fluid), insert molding, IMC (in-mold coating) molding, extrusion molding, sheet forming, thermoforming, rotational molding, laminate molding, and press forming are employable. Also a molding process based on a hot-runner system is selectable.

<Method for Manufacturing Resin Molded Article with Plated Layer>

The method for manufacturing a resin molded article with a plated layer according to this invention characteristically include, as illustrated in FIG. 2, applying the composition for forming a laser direct structuring layer which contains a water-compatible organic substance, water, and a laser direct structuring additive, to the surface of a thermoplastic resin molded article; removing the water; and irradiating laser to form a plated layer. The method preferably includes washing of the plated layer after it was formed. The method also include a process of ultrasonic cleaning when the water-compatible organic substance is of water-insoluble type, and used in a suspended manner.

With such configuration, it becomes now possible to form the plated layer on the surface of the resin molded article, even without adding the LDS additive to the thermoplastic resin composition.

Methods of applying the LDS layer-forming composition to the surface of the resin molded article is preferably coating, but not specifically limited thereto. The coating includes not only brush coating, but also so-called hand coating. In this invention, the LDS layer-forming composition is preferably stirred before being applied to the surface of the resin molded article. As a result of stirring, the LDS layer will have the LDS additive more uniformly dispersed therein.

The LDS layer-forming composition is preferably applied so that the LDS layer after dried will have an average thickness of 0.1 to 1000 μm, and more preferably 0.5 to 300 μm.

Means for removing water is preferably drying, but not limited thereto. The drying may be effected either by natural drying or heat drying. The drying temperature in the heat drying is typically 50 to 150° C.

The resin molded article in this invention may be a flat substrate, or may be a partially or entirely curved resin molded article. The resin molded article is not always necessarily a final product, but is also construed to include various parts. The resin molded article in this invention is preferably used for portable electronic devices, parts of vehicles and medical instruments, and electronic parts containing other electronic circuits. Since the resin molded article has all of high impact resistance, high rigidity and high heat resistance, and also has a small anisotropy and small warp, so that it is particularly useful as internal structures and enclosures of electronic organizer, PDA such as portable computer, pager, mobile phone and PHS. The resin molded article is particularly suitable for flat parts having an average thickness (excluding ribs) of 1.2 mm or thinner (the lower limit value is typically 0.4 mm or above, although not specifically limited), and is extremely suitable for enclosures of mobile electronic devices.

In this invention, laser is irradiated as illustrated in FIG. 2(1) on the LDS layer 22 provided to the surface of the resin molded article 21. The laser in this process is suitably selectable from known lasers such as YAG laser, excimer laser and electromagnetic laser without special limitation, wherein YAG laser is preferable. The wavelength of laser is not specifically limited, and is preferably within the range from 200 nm to 1200 nm, and particularly from 800 nm to 1200 nm.

Upon being irradiated with laser, the LDS additive 23 is activated only in the portion irradiated with laser. While keeping such activated state, the resin molded article 21 having the LDS layer 22 formed thereon is applied to a plating solution. The plating solution is widely selectable from known plating solutions without special limitation, wherein those mixed with copper, nickel, gold, silver or palladium as a metal component is preferable, and copper is more preferable.

Also methods of applying the resin molded article 21 with the LDS layer 22 to the plating solution are not specifically limited, wherein exemplified is a method of placing the article into a liquid formulated with the plating solution. The resin molded article after being applied to the plating solution will have the plated layer 24 formed thereon only in the portion irradiated with laser.

The method of this invention can achieve a circuit fineness of 1 mm or smaller, and even 150 μm or smaller (the lower limit value is typically 30 μm or larger, although not specifically limited). Such circuit may suitably be used as an antenna that is a part of mobile electronic devices. More specifically, a preferred embodiment of the resin molded article is exemplified by a resin molded article whose plated layer, provided on the surface of a part of mobile electronic devices, can act as an antenna.

The method of this invention may also include a process of washing off the laser non-irradiated portion of the LDS layer 25, after the laser irradiation, crafter formation of the plated layer. For example, in the above-described mode illustrated in FIG. 2(3), the LDS additive 23 is activated under irradiation with laser, and the unirradiated portion of the LDS layer is then washed off. The washing is preferably effected by using a solvent capable of removing the water-compatible organic substance contained in the LDS layer. More preferably, the washing is water washing. The washing in this invention, although illustrated in FIG. 2 to be conducted before the plated layer is formed, may succeed formation of the plated layer.

The resin molded article with a plated layer of this invention is preferably manufactured by using the kit of this invention.

EXAMPLES

This invention will further be detailed below referring to Examples. Note that materials, amounts of consumption, ratios, process details, and process procedures described in Examples below may properly be modified without departing from the spirit of this invention. Accordingly, the scope of this invention is by no means limited by the specific examples illustrated below.

<Resin>
PAMXD6: polymetaxylylene adipamide, S6007, from Mitsubishi Gas Chemical Company
Amilan (registered trademark) CM3001-N: polyamide resin, from Toray Industries, Inc.
PC: polycarbonate resin, Iupilon S-3000, from Mitsubishi Engineering-Plastics Corporation
PBT: polybutylene terephthalate resin, 5008, from Mitsubishi Chemical Company
<Glass Fiber>
03T-296GH: from Nippon Electric Glass Co., Ltd.
JAFT2H: from Owens Corning LLC
T-571: from Nippon Electric Glass Co., Ltd.
T-127: from Nippon Electric Glass Co., Ltd.
<Hydrolysis Resistance Modifier>
Adeka Sizer EP-17: from Adeka Corporation
<Antioxidant>
IRGANOX 1010: from BASF
<Talc>
Micron White 5000S: from Hayashi Kasei Co., Ltd.
<Mold Releasing Agent>
CS-8CP: from Nitto Kasei Co., Ltd.
Hostamont NAV101: from Hoechst AG
Hoechst Wax E Powder: from Clariant Japan K.K.
PE520 polyethylene wax: from Clariant Japan K.K.
<Fire Retardant>
PATOX-M: antimony trioxide, from Nihon Seiko Co., Ltd.
Great Lakes PDBS-80: polydibromostyrene, from Great Lakes Chemical Corporation
KFBS: potassium perfluorobutanesulfonate, from Mitsubishi Materials Corporation
<Antidripping Agent>
PTFE 6-J: polytetrafluoroethylene, from Du Pont-Mitsui Fluorochemicals Company, Ltd.
<Pigment>
CB-1: carbon black, #45, from Mitsubishi Chemical Company
ZnS: zinc sulfide, Sachtolith HDS, from Sachtleben Chemie GmbH
RB948G: carbon black, from Koshigaya Kasei Co., Ltd.
CB-2: carbon black, #650B, from Mitsubishi Chemical Company
<Water-Compatible Organic Substance>
PVA paste: liquid glue "LIQUID GLUE", from Lemon Company, containing 9.9% by weight of PVA paste and 90.1% by weight of water HEC (hydroxyethyl cellulose): SP600, from Daicel FineChem Ltd.
Gelatin: New Silver, from Nitta Gelatin Inc.
Water-soluble polyurethane: Hydran, from DIC Corporation
<<Method of Preparing Water-Compatible Organic Substance A>>

In a 50 ml sample tube, 1.3 g of polyvinyl acetate, 11.9 g of pure water, and 0.1 g of Black 1G were placed, and stirred using a spatula, to thereby prepare water-soluble organic substance A.
<LDS Additive>
Black 1G: from The Shepherd Color Company
CP5C: antimony doped tin oxide (95% by weight of tin oxide, 5% by weight of antimony oxide, 0.02% by weight of lead oxide, 0.004% by weight of copper oxide) (from Keeling & Walker Limited)

<Compound of Thermoplastic Resin Composition>

Each of the individual components were precisely weight following the compositional ratio listed in Table shown later, the components excluding the glass fiber were blended in a tumbler, fed into a twin-screw extruder (TEM26SS, from Toshiba Machine Co., Ltd.) from the base thereof and melted, to which the glass fiber was fed from the side to manufacture resin pellets (thermoplastic resin composition). The temperature of extruder was set to 280° C. for Examples 1 to 4, and 9 to 24, and Comparative Examples 1 to 4, and 10 to 14; set to 290° C. for Examples 5 to 7, and Comparative Examples 5 to 8; and set to 260° C. for Example 8 and Comparative Example 9.

<Plate Test>

The resin was molded in dies having a 60×60 mm cavity with a thickness of 2 mm, through a 60 mm wide fan gate with a thickness of 1.5 mm. The gate portion was cut off to obtain a plate test specimen. Color of the obtained test specimen was visually observed.

<Flexural Strength>

The resin pellets obtained by the manufacturing method described above were dried at 120° C. for 4 hours, and injection-molded into an ISO tensile test specimen of 4 mm thick, using SG125-MII from Sumitomo Heavy Industries, Ltd., at a cylinder temperature of 280° C. and a die temperature of 130° C.

Using the ISO tensile test specimen (4 mm thick), the flexural strength (in MPa) was measured in compliance with ISO 178 at 23° C.

<Charpy Impact Strength>

Using the ISO tensile test specimen (4 mm thick) obtained above, notched and unnotched Charpy impact strengths (in $KJ/m^2$) were measured in compliance with ISO 179 at 23° C.

<Preparation of LDS Layer-Forming Composition and Coating on Plate Test Specimen>

Each of the individual components was weighed in a sample tube according to the compositional ratio listed in Table shown later, and mixed using a spatula to prepare the LDS layer-forming composition (LDS layer-forming coating). The thus prepared LDS layer-forming composition was hand-coated using a spatula on the plate test specimen obtained above, and then allowed to dry naturally. The composition was, however, not coated in Comparative Examples 1, 3, 4, 6 to 14.

<Appearance of Plating (Platability)>

Within a 55×40 mm area on the thus obtained plate test specimen, laser was irradiated using a laser marker "LP-Z Series" from SUNX Co., Ltd. (YAG laser at 1064 nm, maximum output=13 W), at an output of 100, 80, 60 or 40%, pulse periods of 50 psec and 20 psec, and a scanning speed of 2 m/s. The subsequent process of forming the plated layer was carried out using an electroless plating bath "MID Copper 100×B Strike" from MacDermid, Inc. at 70° C. The platability was judged by visually observing the thickness of plated layer over 10 minutes.

The platability was evaluated based on the number of square cells showing a good appearance without surface irregularity, from 10 square cells partitioned on each sample, ranked as below:

A: 9 to 10 cells (a good appearance observed over the entire surface of 10-cell sample, without showing irregularity);
B: 7 to 8 cells;
C: 4 to 6 cells;
D: 2 to 3 cells; and
E: 0 to 1 cell (a poor appearance observed over the entire surface of 10-cell sample, showing irregularity).

<Appearance of Laser-Unirradiated Portion>

The appearance of the laser-unirradiated portion of each plate test specimen obtained above was visually observed, and evaluated as below:

○: good appearance observed without surface irregularity; and
x: poor appearance observed with surface irregularity.

<Fire Retardancy>

The resin pellets obtained by the method for manufacturing described above were dried at 120° C. for four hours, and injection-molded into an UL test specimen of 125 mm long, 13 mm wide and 1.6 mm thick, using an injection molding machine "J50-EP" from The Japan Steel Works, Ltd., at a cylinder temperature of 280° C. and a die temperature of 130° C.

The fire retardancy of each resin composition was evaluated in compliance with UL 94 test (the Standard for Safety of Flammability of Plastic Materials for Parts in Devices and Appliances Testing), specified by Underwriters Laboratories Inc. (UL), USA, using the UL test specimen obtained as described above, having been moisture-conditioned in a thermostat chamber at 23° C. and 50% humidity for 48 hours. UL94V is a method of evaluating the fire retardancy based on the lingering flame time and dripping property, when a test specimen of a certain size is held vertically, and a burner flame is applied thereto for 10 seconds. The resin to be ranked at V-0, V-1 or V-2 needs to satisfy the criteria listed in Table below.

TABLE 1

|  | V-0 | V-1 | V-2 |
|---|---|---|---|
| Lingering flame time for each specimen | ≤10 sec | ≤30 sec | ≤30 sec |
| Total flaming combustion for all 5 specimens | ≤50 sec | ≤250 sec | ≤250 sec |
| Cotton ignited by flaming drips | No | No | Yes |

The lingering flame time refers to the duration of time over which the specimen sustains flaming combustion, after the ignition source was regressed. "Cotton ignited by flaming drips" is determined whether or not flaming drips ignite cotton placed approximately 300 mm below the lower end of the specimen. Even any one of five specimens did not satisfy the criteria, the resin was determined to not satisfy V-2, and evaluated as NR (not rated).

TABLE 2

| | | | Example 1 | Example 2 | Comparative Example 1 | Comparative Example 2 | Example 3 |
|---|---|---|---|---|---|---|---|
| Thermoplastic resin composition | Resin | PAMXD6 | 100 | 100 | 100 | 100 | 100 |
| | | Amilan CM3001-N | 11 | 11 | 11 | 11 | 11 |
| | Glass fiber | 03T-296GH | | | 128 | | |
| | | JAFT2H | 116 | 116 | | 116 | 120 |
| | Talc | Micron white 5000S | 4.4 | 4.4 | 9 | 4.4 | 4.4 |
| | Mold releasing agent | CS-8CP | | | 0.7 | | |
| | | Hostamont NAV101 | 0.1 | 0.1 | | 0.1 | 0.1 |
| | | Hoechst wax E powder | 0.1 | 0.1 | | 0.1 | 0.1 |
| | Fire retardant composition | Antimony trioxide PATOX-M | | | | | |
| | | Great Lakes PDBS-80 | | | | | |
| | LDS additive | Black1G | | | 7 | | |
| | Pigment | CB-1 | 0.3 | | | 0.3 | 0.2 |
| | | ZnS | | | | | 5 |
| LDS layer-forming composition | Paste/water | PVA paste/water | 100 | 100 | | 100 | 100 |
| | LDS additive | Black 1G | 1 | 1 | | | 1 |
| Results | | Color of plate test specimen | black | pale yellow | black | black | grey |
| | | Flexural strength (MPa) | 380 | 390 | 280 | 380 | 360 |
| | | Unnotched Charpy impact strength (KJ/m$^2$) | 68 | 72 | 33 | 68 | 62 |
| | | Notched Charpy impact strength (KJ/m$^2$) | 10 | 11 | 4.1 | 10 | 9 |
| | | Appearance of plating | A | A | A | E | A |
| | | Appearance of laser non-irradiated portion | ○ | ○ | ○ | ○ | ○ |
| | | Fire retardancy | | | | | |

| | | | Example 4 | Example 3 | Comparative Example 4 | Example 9 | Comparative Example 10 |
|---|---|---|---|---|---|---|---|
| Thermoplastic resin composition | Resin | PAMXD6 | 100 | 100 | 100 | 100 | 100 |
| | | Amilan CM3001-N | 11 | 11 | 11 | 11 | 11 |
| | Glass fiber | 03T-296GH | | | | | |
| | | JAFT2H | 132 | 120 | 132 | 132 | 132 |
| | Talc | Micron white 5000S | 4.9 | 4.4 | 4.9 | 4.9 | 5 |
| | Mold releasing agent | CS-8CP | | | | | |
| | | Hostamont NAV101 | 0.1 | 0.1 | 0.1 | 0.1 | 0.1 |
| | | Hoechst wax E powder | 0.1 | 0.1 | 0.1 | 0.1 | 0.1 |
| | Fire retardant composition | Antimony trioxide PATOX-M | 5.5 | | 5.5 | 5.5 | 5.5 |
| | | Great Lakes PDBS-80 | 11 | | 11 | 11 | 11 |
| | LDS additive | Black1G | | 7 | 7 | | 7 |
| | Pigment | CB-1 | 0.4 | 0.2 | 0.4 | | 0.4 |
| | | ZnS | | 5 | | | |
| LDS layer-forming composition | Paste/water | PVA paste/water | 100 | | | 100 | |
| | LDS additive | Black 1G | 1 | | | 1 | |
| Results | | Color of plate test specimen | black | grey | black | pale yellow | black |
| | | Flexural strength (MPa) | 340 | 280 | 260 | 350 | 260 |
| | | Unnotched Charpy impact strength (KJ/m$^2$) | 49 | 33 | 26 | 52 | 26 |
| | | Notched Charpy impact strength (KJ/m$^2$) | 9 | 4.1 | 4.1 | 10 | 4.1 |
| | | Appearance of plating | A | E | E | A | E |
| | | Appearance of laser non-irradiated portion | ○ | ○ | ○ | ○ | ○ |
| | | Fire retardancy | V-0 | | NR | V-0 | V-0 |

TABLE 3

| | | | Example 5 | Example 6 | Example 7 | Comparative Example 5 | Comparative Example 6 | Comparative Example 7 | Comparative Example 8 |
|---|---|---|---|---|---|---|---|---|---|
| Thermoplastic resin composition | Thermoplastic resin | PC | 100 | 100 | 100 | 100 | 100 | 100 | 100 |
| | Glass fiber | T-571 | | 11.2 | 43.6 | | 11.2 | | |
| | Mold releasing agent | PE520 | | 0.6 | 0.7 | | 0.6 | | |
| | Pigment | RB948G | 0.1 | 0.1 | 0.1 | 0.1 | 0.1 | 0.1 | |
| | Fire retardant composition | KFBS | | | 0.1 | | | | |
| | Anti dripping agent | PTFE 6-J | | | 0.1 | | | | |
| | LDS additive | Black 1G | | | | | | 8.7 | 8.7 |
| LDS layer-forming composition | Paste/water | PVA paste/water | 100 | 100 | 100 | 100 | | | |
| | LDS additive | Black 1G | 1 | 1 | 1 | | | | |
| Results | | Color of plate test specimen | black | black | black | black | black | black | black |
| | | Appearance of plating (platability) | A | A | A | E | E | E | A |
| | | Appearance of laser non-irradiated portion | ○ | ○ | ○ | ○ | ○ | ○ | ○ |

TABLE 4

|  |  |  | Example 8 | Example 9 |
|---|---|---|---|---|
| Thermoplastic resin composition | Resin | PBT 5008/F | 100 | 100 |
|  | Glass fiber | T-127 | 43 | 43 |
|  | Hydrolysis resistance modifier | Adeka Sizer EP-17 | 0.6 | 0.6 |
|  | Antioxidant | IRGANOX-1010 | 0.3 | 0.3 |
|  | Pigment | CB-2 | 0.6 | 0.6 |
| LDS layer-forming composition | Paste/water | PVA paste/water | 100 |  |
|  | LDS Additive | Black 1G | 1 |  |
| Results | Color of plate test specimen |  | black | black |
|  | Flexural strength (MPa) |  | 210 | 210 |
|  | Unnotched Charpy impact strength (KJ/m$^2$) |  | 59 | 59 |
|  | Notched Charpy impact strength (KJ/m$^2$) |  | 10 | 10 |
|  | Appearance of plating |  | A | E |
|  | Appearance of laser unirradiated portion |  | ○ | ○ |

TABLE 5

|  |  |  | Example 10 | Comparative Example 11 | Comparative Example 12 | Example 11 | Example 12 |
|---|---|---|---|---|---|---|---|
| Thermoplastic resin composition | Resin | PAMXD6 | 100 | 100 | 100 | 100 | 100 |
|  |  | Amilan CM3001-N | 11 | 11 | 11 | 11 | 11 |
|  | Glass fiber | JAFT2H | 132 |  | 132 | 116 | 116 |
|  |  | T-296GH |  | 128 |  |  |  |
|  | Talc | Micron White 5000S | 4.9 | 9 | 4.9 | 4.4 | 4.4 |
|  | Mold releasing agent | Hostamont NAV101 | 0.1 |  | 0.1 | 0.1 | 0.1 |
|  |  | Hoechst Wax E Powder | 0.1 |  | 0.1 | 0.1 | 0.1 |
|  |  | CS-8CP |  | 0.7 |  |  |  |
|  | Fire retardant composition | Antimony trioxide PATOX-M | 5.5 |  | 5.5 |  |  |
|  |  | Great Lakes PDBS-80 | 11 |  | 11 |  |  |
|  | LDS additive | Black1G |  | 7 | 7 |  |  |
|  | Pigment | CB-1 |  | 0.3 |  | 0.3 | 0.3 |
|  |  | ZnS |  |  |  |  |  |
| LDS layer-forming composition | Water-compatible organic substance | PVA paste/water | 111 |  |  | 111 | 111 |
|  | LDS additive | Black 1G | 1 |  |  | 0.1 | 0.6 |
| Results | Color of plate test specimen |  | grey | black | grey | black | black |
|  | Flexural strength (MPa) |  | 350 | 273 | 267 | 380 | 380 |
|  | Unnotched Charpy impact strength (KJ/m$^2$) |  | 52 | 31 | 28 | 68 | 68 |
|  | Notched Charpy impact strength (KJ/m$^2$) |  | 10 | 3.7 | 4.5 | 10 | 10 |
|  | Appearance of plating |  | A | E | E | C | B |
|  | Appearance of laser unirradiated portion |  | ○ | ○ | ○ | ○ | ○ |
|  | Fire retardancy |  | V-0 | NR | V-0 | NR | NR |

|  |  |  | Example 13 | Example 14 | Example 15 | Example 16 |
|---|---|---|---|---|---|---|
| Thermoplastic resin composition | Resin | PAMXD6 | 100 | 100 | 100 | 100 |
|  |  | Amilan CM3001-N | 11 | 11 | 11 | 11 |
|  | Glass fiber | JAFT2H | 116 | 116 | 116 | 116 |
|  |  | T-296GH |  |  |  |  |
|  | Talc | Micron White 5000S | 4.4 | 4.4 | 4.4 | 4.4 |
|  | Mold releasing agent | Hostamont NAV101 | 0.1 | 0.1 | 0.1 | 0.1 |
|  |  | Hoechst Wax E Powder | 0.1 | 0.1 | 0.1 | 0.1 |
|  |  | CS-8CP |  |  |  |  |
|  | Fire retardant composition | Antimony trioxide PATOX-M |  |  |  |  |
|  |  | Great Lakes PDBS-80 |  |  |  |  |
|  | LDS additive | Black1G |  |  |  |  |
|  | Pigment | CB-1 | 0.3 | 0.3 | 0.3 | 0.3 |
|  |  | ZnS |  |  |  |  |
| LDS layer-forming composition | Water-compatible organic substance | PVA paste/water | 111 | 111 | 111 | 111 |
|  | LDS additive | Black 1G | 6 | 12 | 28 | 37 |
| Results | Color of plate test specimen |  | black | black | black | black |
|  | Flexural strength (MPa) |  | 380 | 380 | 380 | 380 |
|  | Unnotched Charpy impact strength (KJ/m$^2$) |  | 68 | 68 | 68 | 68 |
|  | Notched Charpy impact strength (KJ/m$^2$) |  | 10 | 10 | 10 | 10 |
|  | Appearance of plating |  | A | A | B | C |
|  | Appearance of laser unirradiated portion |  | ○ | ○ | ○ | ○ |
|  | Fire retardancy |  | NR | NR | NR | NR |

TABLE 6

|  |  |  | Example 17 | Example 18 | Example 19 | Example 20 |
|---|---|---|---|---|---|---|
| Thermoplastic resin composition | Resin | PAMXD6 | 100 | 100 | 100 | 100 |
|  |  | Amilan CM3001-N | 11 | 11 | 11 | 11 |
|  | Glass fiber | JAFT2H | 116 | 116 | 116 | 116 |
|  |  | T-296GH |  |  |  |  |
|  | Talc | Micron White 5000S | 4.4 | 4.4 | 4.4 | 4.4 |
|  | Mold releasing agent | Hostamont NAV101 | 0.1 | 0.1 | 0.1 | 0.1 |
|  |  | Hoechst Wax E Powder | 0.1 | 0.1 | 0.1 | 0.1 |
|  | Fire retardant composition | Antimony trioxide PATOX-M |  |  |  |  |
|  |  | Great Lakes PDBS-80 |  |  |  |  |
|  | LDS additive | CP5C |  |  |  |  |
|  | Pigment | CB-1 | 0.3 | 0.3 | 0.3 | 0.3 |
| LDS layer-forming composition | Water-compatible organic substance | HEC | 4 |  |  |  |
|  |  | Gelatin |  | 5 |  |  |
|  |  | Water-compatible organic substance A |  |  | 32 |  |
|  |  | Water-soluble polyurethane |  |  |  | 16 |
|  |  | Water | 100 | 100 | 100 | 100 |
|  | LDS additive | Black 1G CP5C | 1 | 1 | 1 | 1 |
| Results |  | Color of plate test specimen | black | black | black | black |
|  |  | Flexural strength (MPa) | 380 | 380 | 380 | 380 |
|  |  | Unnotched Charpy impact strength (KJ/m$^2$) | 68 | 68 | 68 | 68 |
|  |  | Notched Charpy impact strength (KJ/m$^2$) | 10 | 10 | 10 | 10 |
|  |  | Appearance of plating | A | A | C | A |
|  |  | Appearance of laser unirradiated portion | ○ | ○ | ○ | ○ |
|  |  | Fire retardancy | NR | NR | NR | NR |

TABLE 7

|  |  |  | Example 21 | Example 22 | Comparative Example 13 | Example 23 | Example 24 | Comparative Example 14 |
|---|---|---|---|---|---|---|---|---|
| Thermoplastic resin composition | Resin | PAMXD6 | 100 | 100 | 100 | 100 | 100 | 100 |
|  |  | Amilan CM3001-N | 11 | 11 | 11 | 11 | 11 | 11 |
|  | Glass fiber | JAFT2H | 116 | 116 |  | 132 | 132 | 132 |
|  |  | T-296GH |  |  | 128 |  |  |  |
|  | Talc | Micron White 5000S | 4.4 | 4.4 | 9 | 4.9 | 4.9 | 4.9 |
|  | Mold releasing agent | Hostamont NAV101 | 0.1 | 0.1 |  | 0.1 | 0.1 | 0.1 |
|  |  | Hoechst Wax E Powder | 0.1 | 0.1 | 0.7 | 0.1 | 0.1 | 0.1 |
|  | Fire retardant composition | Antimony trioxide PATOX-M |  |  |  | 5.5 | 5.5 | 5.5 |
|  |  | Great Lakes PDBS-80 |  |  |  | 11 | 11 | 11 |
|  | LDS additive | CP5C |  |  | 7 |  |  | 7 |
|  | Pigment | CB-1 | 0.3 |  |  | 0.4 |  |  |
| LDS layer-forming composition | Water-compatible organic substance | PVA paste/water | 111 | 111 |  | 111 | 111 |  |
|  | LDS additive | Black 1G CP5C | 1 | 1 |  | 1 | 1 |  |
| Results |  | Color of plate test specimen | black | pale yellow | grey | black | grey | grey |
|  |  | Flexural strength (MPa) | 380 | 390 | 252 | 340 | 350 | 240 |
|  |  | Unnotched Charpy impact strength (KJ/m$^2$) | 68 | 72 | 30 | 49 | 52 | 25 |
|  |  | Notched Charpy impact strength (KJ/m$^2$) | 10 | 11 | 3.7 | 9 | 10 | 4.0 |
|  |  | Appearance of plating | B | C | A | B | C | E |
|  |  | Appearance of laser unirradiated portion | ○ | ○ | ○ | ○ | ○ | ○ |
|  |  | Fire retardancy | NR | NR | NR | V-0 | V-0 | V-0 |

REFERENCE SIGNS LIST

11 resin molded article
12 LDS additive
13 plated layer
21 resin molded article
22 LDS layer
23 LDS additive
24 plated layer
25 LDS layer in unirradiated portion

The invention claimed is:

1. A kit, comprising:
a composition for forming a laser direct structuring layer comprising a water-compatible organic substance, water, and a laser direct structuring additive, and
a thermoplastic resin composition containing a thermoplastic resin and a glass filler;
wherein the laser direct structuring additive includes at least one selected from the group consisting of (i) a compound containing copper and chromium, (ii) an oxide containing tin and at least one of antimony and phosphorus, and (iii) an electrically conductive oxide containing at least two species of metals and having a resistivity of $5 \times 10^3$ Ω cm or smaller.

2. The kit of claim 1, wherein the thermoplastic resin composition contains substantially no laser direct structuring additive.

3. The kit of claim 1, wherein the thermoplastic resin is a crystalline resin.

4. The kit of claim 3, wherein the crystalline resin is a polyamide resin.

5. The kit of claim 3, wherein the crystalline resin is a thermoplastic polyester resin.

6. The kit of claim 1, wherein the thermoplastic resin is an amorphous resin.

7. The kit of claim 6, wherein the amorphous resin is a polycarbonate resin.

8. The kit of claim 1, wherein the thermoplastic resin composition contains at least one of a dye-pigment and a fire retardant composition.

9. The kit of claim 1, wherein the thermoplastic resin composition contains at least one of a pigment and a fire retardant composition.

10. The kit of claim 1, wherein the thermoplastic resin composition contains a black dye-pigment.

11. The kit of claim 1, wherein the thermoplastic resin composition contains an antimony-containing fire retardant or fire retardant auxiliary.

12. The kit of claim 1, wherein the thermoplastic resin composition contains a halogen-containing fire retardant.

13. A method for manufacturing a resin molded article with a plated layer, the method using the kit according to claim 1; and the method comprising:
    applying the composition for forming a laser direct structuring layer to a surface of a thermoplastic resin molded article formed of the thermoplastic resin composition;
    removing the water; and
    then irradiating laser to form a plated layer.

14. The method for manufacturing a resin molded article with a plated layer of claim 13, the method further comprising washing the plated layer after the plated layer was formed.

15. The method for manufacturing a resin molded article with a plated layer of claim 13, wherein the thermoplastic resin molded article comprises a crystalline resin.

16. The method for manufacturing a resin molded article with a plated layer of claim 13, wherein the thermoplastic resin molded article comprises an amorphous resin.

17. The kit of claim 1, wherein the glass filler is not continuous.

18. The kit of claim 1, wherein the glass filler is at least one of chopped strand and milled fiber.

19. The kit of claim 1, wherein the composition for forming a laser direct structuring layer is free from a glass filler.

20. The kit of claim 1, wherein the composition for forming a laser direct structuring layer is free from a glass filler and the thermoplastic resin composition contains substantially no laser direct structuring additive.

21. The kit of claim 1, wherein the thermoplastic resin contains a polyamide resin obtained by polycondensation of xylylene diamine with an $\alpha,\omega$-dibasic acid.

22. The kit of claim 1, wherein the thermoplastic resin contains a polyamide resin obtained by polycondensation of paraxylylene diamine and/or metaxylylene diamine, with sebacic acid and/or adipic acid.

23. The kit of claim 1, wherein the (iii) electrically conductive oxide containing at least two species of metals and having a resistivity of $5\times10^3$ $\Omega\cdot$cm or smaller includes an oxide containing zinc and aluminum.

24. The kit of claim 1, wherein the (ii) oxide containing tin and at least one of antimony and phosphorus includes an oxide containing tin and antimony.

* * * * *